(12) United States Patent
Miyoshi et al.

(10) Patent No.: US 8,029,856 B2
(45) Date of Patent: Oct. 4, 2011

(54) FILM FORMATION METHOD AND APPARATUS

(75) Inventors: Hidenori Miyoshi, Nirasaki (JP); Isao Gunji, Nirasaki (JP); Hitoshi Itoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1100 days.

(21) Appl. No.: 11/747,647

(22) Filed: May 11, 2007

(65) Prior Publication Data

US 2008/0000416 A1    Jan. 3, 2008

(30) Foreign Application Priority Data

May 16, 2006 (JP) ................................ 2006-136657
Feb. 23, 2007 (JP) ................................ 2007-043910

(51) Int. Cl.
  *B05D 3/02* (2006.01)
(52) U.S. Cl. ....................................................... 427/229
(58) Field of Classification Search .................... 427/229
  See application file for complete search history.

(56) References Cited

U.S. PATENT DOCUMENTS

| | | | | |
|---|---|---|---|---|
| 5,106,462 A | * | 4/1992 | Kawakami et al. | 205/164 |
| 2001/0021570 A1 | * | 9/2001 | Lin et al. | 438/455 |
| 2003/0180451 A1 | * | 9/2003 | Kodas et al. | 427/123 |
| 2005/0146257 A1 | * | 7/2005 | Trujillo et al. | 313/17 |
| 2007/0289604 A1 | * | 12/2007 | Fukunaga et al. | 134/3 |

FOREIGN PATENT DOCUMENTS

| | | |
|---|---|---|
| JP | 2745677 | 2/1998 |
| JP | 2004-27352 | 1/2004 |
| WO | WO2005106936 | * 11/2005 |

OTHER PUBLICATIONS

Mouche et al., "Metal-organic chemical vapor deposition of copper using hydrated copper formate as a new precursor," Thin Solid Films 262, pp. 1-6 (1995).*

A. Gupta, et al., "Laser writing of copper lines from metalorganic films", Applied Physics Letters, 51 (26), Dec. 28, 1987, pp. 2254-2256.

Marie-Jose Mouche, et al., "Metal-organic chemical vapor deposition of copper using hydrated copper formate as a new precursor", Elsevier Science S. A., Thin Solid Films, 262, 1-6, 1995, 6 Pages.

A. Keller, et al., "Nature", vol. 162, No. 4119, Oct. 9, 1948, pp. 580-582.

* cited by examiner

*Primary Examiner* — Michael Cleveland
*Assistant Examiner* — Robert Vetere
(74) *Attorney, Agent, or Firm* — Oblon, Spivak, McClelland, Maier & Neustadt, L.L.P.

(57) ABSTRACT

A film formation method is arranged to react carboxylic acid with an oxygen-containing metal compound to produce carboxylate salt gas of a metal of the metal compound. The method then supplies the carboxylate salt gas of the metal onto a substrate. The method applies energy to the substrate to decompose the carboxylate salt of the metal supplied onto the substrate, thereby forming a metal film.

10 Claims, 18 Drawing Sheets

FILM FORMATION METHOD AND APPARATUS

BACKGROUND OF THE INVENTION

1. Field of the Invention

The present invention relates to a film formation method and film formation apparatus for forming a metal film such as a copper film used as an interconnection of a semiconductor, and also relates to a storage medium.

2. Description of the Related Art

Recently, to meet the requirements for a high operating speed of a semiconductor device, a high degree of micropatterning of an interconnection pattern, and a high degree of integration, demands have arisen for decreasing the capacitance between interconnections, increasing the conductivity of an interconnection, and increasing the electromigration resistance. As a technique meeting these demands, a Cu multilayered interconnection technique using copper (Cu) having conductivity and an electromigration resistance higher than those of aluminum (Al) and tungsten (W) as an interconnection material and using a low-k film as an interlayer dielectric film is attracting attention.

As methods of forming a Cu film of a Cu multilayered interconnection, a physical vapor deposition (PVD) method such as sputtering, a plating method, and a chemical vapor deposition (MOCVD) method that uses a metal organic material by vaporizing it are known. However, the PVD method has a low step coverage, and this makes it difficult to bury a film in a fine pattern. In the plating method, a Cu film contains large amounts of impurities because the plating solution contains additives. Although the MOCVD method readily achieves a high step coverage, large amounts of impurities such as carbon (C), oxygen (O), and fluorine (F) from side-chain groups oriented in Cu atoms remain in a Cu film, and this makes the film quality difficult to improve. In addition, the material is very expensive because the side-chain groups oriented in Cu atoms are complicated. Also, a source gas is difficult to stably supply because the process is thermally unstable and the vapor pressure is low.

By contrast, Patent Document 1 listed later has disclosed a technique in which a CuCl plate is placed in a chamber and etched by generating an Ar gas plasma to produce desorbed species of CuCl, dissociation species of Cu and Cl are produced from the desorbed species by using the Ar gas plasma, and a Cu film is formed on a substrate by direct reduction by making the temperature of the substrate lower than that of the CuCl plate. Patent Document 1 describes that this technique makes it possible to increase the film formation rate, use inexpensive materials, and form a Cu film containing no residual impurities.

Unfortunately, it is difficult for the technique of Patent Document 1 to completely remove Cl from the Cu film, so a slight amount of Cl may remain. Even if the residual amount of Cl is slight, corrosion of a Cu interconnection poses problems such as the rise in interconnection resistance and deterioration of the reliability. Also, since the substrate surface is exposed to the plasma in the initial stages of film formation, the substrate may be chemically or physically damaged. In particular, a low-k film used as an interconnection easily raises the dielectric constant or breaks a microstructure when exposed to the plasma (plasma damage). Furthermore, the plasma sputters members other than the CuCl plate in a reactor, so these members are damaged, or sputtered particles make impurities remain in a film or cause contamination. Accordingly, application of the technique of Patent Document 1 to the Cu multilayered interconnection requires expensive mechanisms and materials in order to solve the above problems.

On the other hand, as a method other than the semiconductor fabrication process, Patent Document 2 listed later has disclosed a method of fabricating a Cu interconnection by a method that is not a wet plating method by using an inexpensive material. This method forms a thin Cu film by coating a substrate with copper(II) formate ($Cu(OCHO)_2$) as an inexpensive organic Cu compound or its hydrate, and heating the substrate in a non oxidizing ambient. Similarly, Non-Patent Document 1 listed later has reported that a Cu interconnection is formed by heating a substrate coated with copper(II) formate dihydrate with a laser beam having a narrowed light diameter. Each of these methods uses the phenomenon that copper(II) formate changes into Cu by thermal decomposition. Although these methods can form a Cu film at a low cost, they are unsuited to bury a metal in a fine shape processed to a nanometer level such as an interconnection of an ultra large scale integrated circuit (ULSI), and the electrical conductivity is lower than the original value of Cu.

Non-Patent Document 2 listed later has reported an attempt that uses inexpensive copper(II) formate hydrate as the material of MOCVD. A powder of copper(II) formate hydrate is placed in a material vessel, and a carrier gas is supplied while the material is heated. A vaporized component produced by heating is transported through a pipe by a carrier gas to the surface of a substrate heated in another reactor. The transported vaporized component thermally decomposes on the substrate surface to form a Cu film on it.

Non-Patent Document 3 listed later has revealed that this vaporized component produced in the material vessel is copper(I) formate. Copper(I) formate (Cu(OCHO)) that readily vaporizes is produced as a gas from copper(II) formate that hardly vaporizes in accordance with a reaction formula indicated by

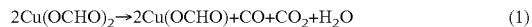

$$2Cu(OCHO)_2 \rightarrow 2Cu(OCHO)+CO+CO_2+H_2O \quad (1)$$

and this gas is transported to a substrate.

Since copper(I) formate is a material that very easily thermally decomposes as reported in Non-Patent Document 3, a thin Cu film is readily formed at a low temperature from copper(I) formate in accordance with a reaction formula indicated by

$$2Cu(OCHO) \rightarrow 2Cu+2CO_2+H_2 \quad (2)$$

In this method, a formate group (OCHO) as a ligand is readily thermally decomposed into $CO_2$ or $H_2$ and exhausted and hence is hardly entrapped in a Cu film. This facilitates the formation of a high purity Cu film containing no impurity. However, a method in which a carrier gas carries a material vaporized from a solid material is generally largely affected by the thermal conduction state in a solid material vessel at a low pressure, and this makes stable supply of the vaporized material difficult. Also, copper(II) formate as the material thermally decomposes and forms a Cu film in the solid material vessel. That is, deterioration of the material readily occurs.

Furthermore, Non-Patent Document 3 has reported silver as a metal that reacts similarly to copper as a formate, and a silver film can be formed as an interconnection layer by the same method, but the same problems as when copper is used similarly arise.

Patent Document 1: Jpn. Pat. Appln. KOKAI Publication No. 2004-27352

Patent Document 2: Japanese Patent No. 2745677

Non-Patent Document 1: A. Gupta and R. Jagannathan, Applied Physics Letters, 51(26), p 2254, (1987)

Non-Patent Document 2: M.-J. Mouche et al, Thin Solid Films 262, p 1, (1995)

Non-Patent Document 3: A. Keller and F. Korosy, Nature, 162, p 580, (1948)

BRIEF SUMMARY OF THE INVENTION

It is an object of the present invention to provide a film formation method and film formation apparatus capable of forming a metal film having a high step coverage and high quality. It is another object of the present invention to provide a computer readable storage medium containing program instructions for executing the method.

According to a first aspect of the present invention, there is provided a film formation method comprising: reacting carboxylic acid with an oxygen-containing metal compound to produce carboxylate salt gas of a metal of the metal compound; supplying the carboxylate salt gas of the metal onto a substrate; and applying energy to the substrate to decompose the carboxylate salt of the metal supplied onto the substrate, thereby forming a metal film.

In the first aspect, the method may be arranged such that the oxygen-containing metal compound is a powder, and the carboxylate salt gas is produced by supplying one of carboxylic acid gas and liquid carboxylic acid to the powder.

In the first aspect, the method may further comprise a step of setting the substrate in a processing vessel held in a vacuum, wherein the carboxylic salt gas is supplied onto the substrate and the metal film is formed in the processing vessel. In this case, the following arrangements may be adopted. Specifically, the carboxylate salt gas is formed outside the processing vessel by reacting carboxylic acid with the oxygen-containing metal compound, and supplied into the processing vessel through a pipe. The oxygen-containing metal compound is a powder, and the carboxylate salt gas is produced by supplying one of carboxylic acid gas and liquid carboxylic acid to the powder. The pipe is formed by coating an inner surface with the oxygen-containing metal compound, and the carboxylate salt gas is produced by causing carboxylic acid gas to flow through the pipe. The carboxylate salt gas is produced by reacting carboxylic acid with the oxygen-containing metal compound in the processing vessel. The oxygen-containing metal compound is made of copper oxide and contained in a member set in the processing vessel.

According to a second aspect of the present invention, there is provided a film formation apparatus comprising: a processing vessel which is held in a vacuum and in which a substrate is set; a substrate support member which supports the substrate in the processing vessel; a gas production/supply system which reacts carboxylic acid with an oxygen-containing metal compound to produce carboxylate salt gas of a metal of the metal compound, and supplies the carboxylate salt gas onto the substrate in the processing vessel; an energy application system which applies energy to the substrate on the substrate support member; and an exhaust system which exhausts the processing vessel, wherein the gas production/supply system supplies the carboxylate salt onto the substrate, and the energy applied by the energy application system decomposes the carboxylate salt to form a metal film on the substrate.

In the second aspect, the gas production/supply system may comprise a reaction unit which produces the carboxylate salt gas by reacting the carboxylic acid with the oxygen-containing metal compound, a carboxylic acid gas supply pipe which supplies the carboxylic acid gas to the reaction unit, and a carboxylate salt supply unit which supplies the carboxylate salt gas from the reaction unit to the processing vessel. In this case, the following arrangements may be adopted. Specifically, the reaction unit comprises a reactor which stores a material powder of the oxygen-containing metal compound. The reaction unit comprises a member made of the oxygen-containing metal compound. The member made of the oxygen-containing metal compound of the reaction unit is an inner surface layer made of the oxygen-containing metal compound and formed on an inner surface of the carboxylic acid gas supply pipe. The carboxylate salt supply unit comprises a shower head which supplies the carboxylate salt gas in the form of a shower.

In the second aspect, the gas production/supply system may comprise a member made of the oxygen-containing metal compound and set in the processing vessel, and a gas supply system which supplies the carboxylic acid gas into the reactor. In this case, the following arrangements may be adopted. Specifically, the gas supply system comprises a carboxylic acid gas production mechanism which produces the carboxylic acid gas, a carboxylic acid gas supply pipe which supplies the carboxylic acid gas to the processing vessel, and a carboxylic acid gas supply unit which supplies the carboxylic acid gas into the processing vessel. The member made of the oxygen-containing metal compound is formed in the carboxylic acid gas supply unit. The carboxylic gas supply unit comprises a shower head including a delivery member having a plurality of delivery holes, the member made of the oxygen-containing metal compound forms a part or the whole of the delivery member, and the carboxylic acid gas supplied to the shower head reacts with the oxygen-containing metal compound before passing through the delivery holes, thereby delivering carboxylate salt gas. The delivery member of the shower head comprises a base body and a coating layer made of the oxygen-containing metal compound and formed on a surface of the base body, and the coating layer functions as a member made of the oxygen-containing metal compound.

In the first and second aspects, it may be arranged such that the carboxylate salt is deposited on the substrate by supplying the carboxylate salt gas onto the substrate, and the carboxylate salt on the substrate is decomposed by applying energy to the substrate on which the carboxylate salt is deposited. Alternatively, it may be arranged such that energy is applied to the substrate while the carboxylate salt gas is supplied onto the substrate.

The metal is preferably one of copper and silver. In this case, the oxygen-containing metal compound may be a material selected from the group consisting of copper(I) oxide ($Cu_2O$), copper(II) oxide (CuO), copper(II) hydroxide ($Cu(OH)_2$), silver(I) oxide ($Ag_2O$), and silver(II) oxide ($Ag_2O_2$). The carboxylic acid is preferably an acid selected from the group consisting of formic acid, acetic acid, propionic acid, valeric acid, and butyric acid. For example, the carboxylic acid is formic acid, the oxygen-containing metal compound is an oxygen-containing copper compound, the carboxylate salt gas is copper formate gas, and the metal film is a copper film.

Energy applied to the substrate may be heat energy. In this case, a resistance heating element formed in a substrate support member which supports the substrate may apply heat energy to the substrate. Alternatively, a heating lamp disposed in a position apart from the substrate may apply heat energy to the substrate.

According to a third aspect of the present invention, there is provided a film formation apparatus comprising: a first processing vessel which is held in a vacuum, in which a substrate is set, and which supplies carboxylate salt containing a predetermined metal to the substrate thus set to deposit a carboxylate salt film on the substrate; a second processing vessel which is held in a vacuum, in which the substrate on which the carboxylate salt film is deposited in the first processing vessel is set, and which applies energy to the substrate thus set to decompose carboxylate salt on the substrate, thereby forming a metal film on the substrate; and a substrate transfer mechanism which transfers the substrate from the first processing vessel to the second processing vessel without breaking the vacuum.

According to a fourth aspect of the present invention, there is provided a computer readable medium containing program instructions to be executed on a processor, wherein when executed by the computer, the program instructions control a film formation apparatus to perform a film formation method comprising: reacting carboxylic acid with an oxygen-containing metal compound to produce carboxylate salt gas of a metal of the metal compound; supplying the carboxylate salt gas of the metal onto a substrate; and applying energy to the substrate to decompose the carboxylate salt of the metal supplied onto the substrate, thereby forming a metal film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be explained below with reference to the accompanying drawing.

First, the concept of a film formation method according to an embodiment of the present invention will be explained below. FIGS. 1A to 1D are schematic views for explaining the concept of the film formation method according to an embodiment of the present invention.

Figure 1A:
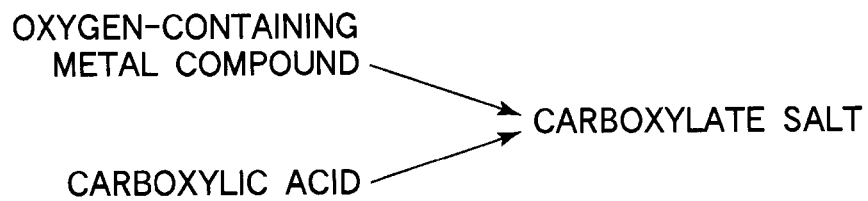
FIGS. 1A to 1D are schematic views for explaining a film formation method according to an embodiment of the present invention.

First, as shown in FIG. 1A, carboxylate salt gas is produced by reacting carboxylic acid with an oxygen-containing metal compound containing a metal of a metal film to be obtained. This makes it possible to control the amount of carboxylate salt to be produced by controlling the amount of carboxylic acid to be supplied, thereby stably supplying the material with high controllability.

Carboxylic acid is preferably an acid having a high vapor pressure and suited to a reaction after vaporization, and examples are formic acid (HCOOH), acetic acid ($CH_3COOH$), propionic acid ($CH_3CH_2COOH$), valeric acid ($CH_3(CH_2)_3COOH$), and butyric acid ($CH_3(CH_2)_2COOH$). It is favorable to use an acid selected from these examples. Formic acid having the highest vapor pressure is favorable among all the acids. Also, formic acid has only H in portions other than a carboxyl group, and this presumably minimizes the amount of intermediate decomposition products entrapped as by-products. Formic acid is preferable in this respect as well.

A metal film can be formed by reacting carboxylic acid as described above with the oxygen-containing metal compound, and a typical example of the oxygen-containing metal compound is a metal oxide. It is also possible to use a metal hydroxide. A metal hydroxide is thermally more unstable than a metal oxide, and therefore sometimes has the merit that the reaction temperature can be lowered.

Favorable examples of the metal are copper (Cu) and silver (Ag). These metals are suitable as interconnection materials because they can form carboxylate salt that readily thermally decomposes together with carboxylic acid, and have very low resistances. When Cu or Ag is used as a metal, examples of the oxygen-containing metal compound are copper(I) oxide ($Cu_2O$), copper(II) oxide (CuO), copper(II) hydroxide ($Cu(OH)_2$), silver(I) oxide ($Ag_2O$), and silver(II) oxide ($Ag_2O_2$). From the viewpoint of the reactivity, copper(I) oxide ($Cu_2O$) and silver(I) oxide ($Ag_2O$) as monovalent oxides are more favorable than copper(II) oxide (CuO) and silver(II) oxide ($Ag_2O_2$) as divalent oxides. Since copper(II) hydroxide ($Cu(OH)_2$) is thermally unstable, the formation temperature of carboxylate salt can be lowered, but the storage stability or the like may decrease. Although Ag(OH) exists for silver, this material is difficult to use because it is thermally too unstable and decomposes at room temperature.

Figure 1B:
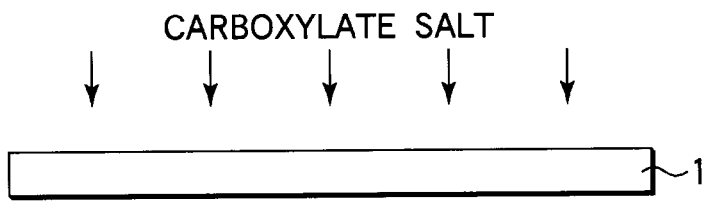

Then, as shown in FIG. 1B, the carboxylate salt gas produced as described above is supplied onto a substrate 1. When carboxylate salt that readily thermally decomposes is selected, the carboxylate salt gas can easily decompose into a metal when given energy. Especially when carboxylic acid having a high vapor pressure as described above is selected, carboxylate salt that readily thermally decomposes can be obtained, and this facilitates the formation of a metal film. Copper(I) formate as carboxylate salt is an unstable material and readily decomposes into copper, so the present invention forms a copper film by using this property. Also, carboxylate salt is preferably supplied in a vacuum in order to minimize oxidation of carboxylate salt and maintain desired components.

Figure 1C:
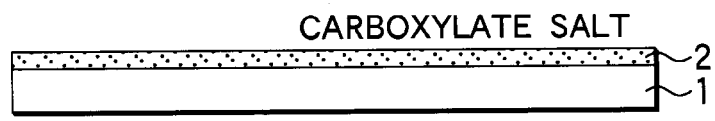

As shown in FIG. 1C, a predetermined amount of carboxylate salt is deposited by adsorption to the substrate 1, thereby forming a carboxylate salt film 2 as a precursor of a metal film. In this step, the temperature of the substrate 1 is preferably about −30° C. to 50° C.

Figure 1D:
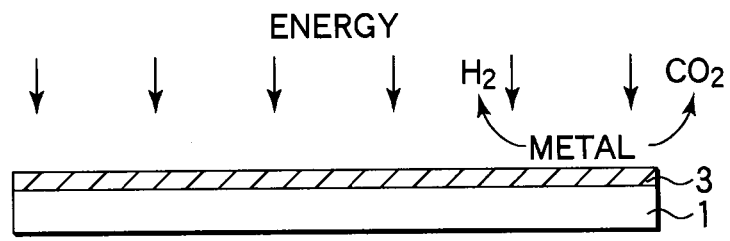

Subsequently, as shown in FIG. 1D, the reaction is advanced by giving energy to the substrate on which the carboxylate salt film 2 is formed, thereby decomposing the carboxylate salt to form a metal film 3.

Heat energy is typically used as this energy. Heat energy can be easily used because it can be given by, e.g., a resistance heating element or heating lamp used in an ordinary film formation apparatus.

In this method as described above, carboxylate salt as a source gas is adsorbed in the form of a gas to the substrate surface, without any thermal decomposition in a vapor phase, and a metal film is formed by application of energy, so the step coverage can increase as in normal CVD. Therefore, the method is applicable to fine patterns in ULSI interconnection steps. Also, since a material more inexpensive than in MOCVD can be used, a film as a metal interconnection can be formed at a low cost.

Figure 2A:
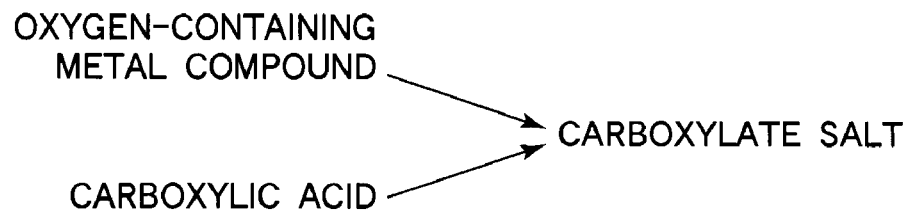
FIGS. 2A to 2C are schematic views for explaining another example of the film formation method according to the embodiment of the present invention.
Figure 2B:
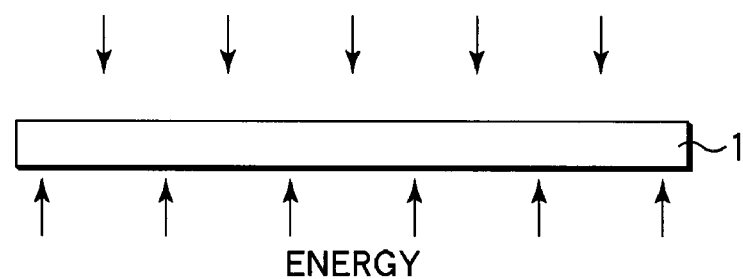
Figure 2C:
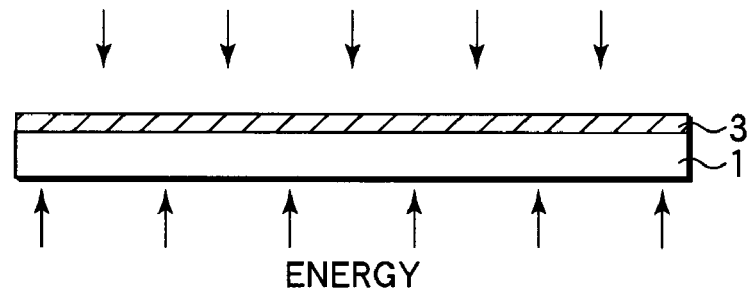

When the step coverage is taken into consideration, it is preferable to adsorb carboxylate salt to the substrate surface and then form a metal film by applying energy as shown in FIGS. 1A to 1D. However, a method shown in FIGS. 2A to 2C is also possible. In FIG. 2A, carboxylate salt is produced in the same manner as in FIG. 1A. After that, as shown in FIG. 2B, energy such as heat energy is applied to a substrate 1, and the produced copper(I) formate gas is supplied onto the substrate 1. In this case, as shown in FIG. 2C, the carboxylate salt gas decomposes immediately after arriving on the substrate 1, thereby forming a metal film 3. This method is more or less inferior in step coverage to the method shown in FIGS. 1A to 1D, but can form a metal film within a time period shorter than that when forming a metal film by applying energy after carboxylate salt is adsorbed onto the substrate surface as shown in FIGS. 1A to 1D.

A most preferable example of the method of forming a metal film by reacting carboxylate salt with the oxygen-containing metal compound as described above is the formation of a Cu film by a reaction between formic acid as carboxylic acid and copper oxide as the oxygen-containing metal compound.

The Cu film formation method as described above will be explained below. It is favorable to use copper(I) oxide as copper oxide in order to increase the reactivity and secure necessary stability, so the following explanation uses copper (I) oxide.

Figure 3A:
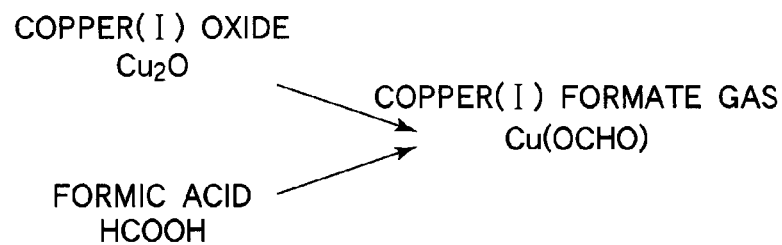
FIGS. 3A to 3D are schematic views for explaining a Cu film formation method according to a typical embodiment of the present invention.

First, as shown in FIG. 3A, copper(I) formate (Cu(OCHO)) gas is produced by reacting formic acid and copper(I) oxide in accordance with a reaction formula indicated by $$Cu_2O + 2HCOOH \rightarrow 2Cu(OCHO) + H_2O \quad (3)$$
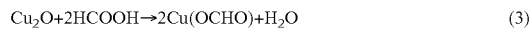
(solid) (gas or liquid) (gas) (gas)

In this case, copper(I) oxide is a solid, and formic acid is a gas or liquid.

The reaction between copper(I) oxide and formic acid can be performed by supplying formic acid gas or liquid formic acid to powdery copper(I) oxide, or by supplying formic acid gas or liquid formic acid to a member made of copper(I) oxide.

Since copper(I) formate gas is thus produced by reacting formic acid with copper(I) oxide, the amount of copper formate to be produced can be controlled by controlling the amount of formic acid to be supplied, so the material can be stably supplied by a controllable method. Also, deterioration of the material hardly occurs compared to the method that thermally decomposes copper(II) formate as used in the conventional technique.

Figure 3B:
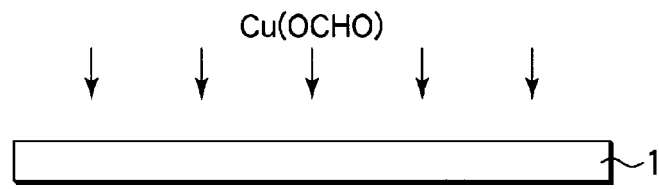

Then, as shown in FIG. 3B, the copper(I) formate gas produced as described above is supplied onto a substrate 1. Copper(I) formate is an unstable material and readily decomposes into copper, so the present invention forms a copper film by using this property. Also, copper(I) formate is supplied in a vacuum since it exists as a gas in a vacuum but readily oxidizes to form copper(I) oxide in the atmosphere. In this case, copper(I) formate is heated to a temperature of about 50° C. to 150° C. so as to be held in the form of a gas. Copper(I) formate of the present invention includes a multimer as well as a monomer. Note that the partial pressure of the formic acid gas must be increased to a certain degree in order to produce a large amount of copper(I) formate gas and suppress decomposition of the produced copper(I) formate in a vapor phase. However, an excessively high pressure is disadvantageous to vaporization and supply of formic acid. Accordingly, the partial pressure of the formic acid gas during the copper(I) formate formation reaction is desirably 133 to 6,650 Pa (1 to 50 Torr).

Figure 3C:
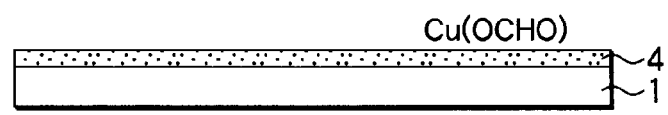

As shown in FIG. 3C, a predetermined amount of copper(I) formate is deposited by adsorption to the substrate 1, thereby forming a copper(I) formate film 4 as a precursor of a copper film. In this step, the temperature of the substrate 1 is preferably about −30° C. to 50° C.

Figure 3D:
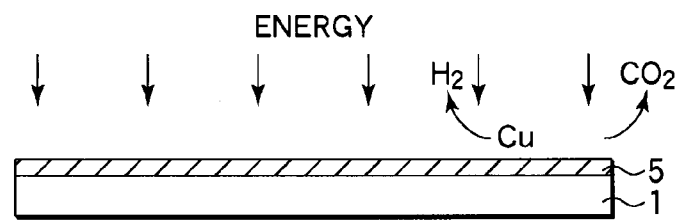

Subsequently, as shown in FIG. 3D, the reaction of the reaction formula indicated by formula (2) presented earlier is advanced by giving energy to the substrate on which the copper(I) formate film 4 is formed, thereby decomposing the copper(I) formate film to form a copper (Cu) film 5.

Heat energy is typically used as this energy. Heat energy can be easily used because it can be given by, e.g., a resistance heating element or heating lamp used in an ordinary film formation apparatus. As described above, copper(I) formate is an unstable material and readily decomposes into copper when heated to about 100° C. to 250° C.

In this method as described above, copper(I) formate as a source gas is adsorbed in the form of a gas to the substrate surface, without any thermal decomposition in a vapor phase, and a Cu film is formed by application of energy, so the step coverage can increase as in normal CVD. Therefore, the method is applicable to fine patterns in ULSI interconnection steps. Also, since materials more inexpensive than in MOCVD are used, a film as a Cu interconnection can be formed at a low cost. Furthermore, the materials are C, O, and H alone except for Cu, a high quality film containing little impurities can be obtained, and there is no problem of corrosion of a Cu interconnection by chlorine unlike in the technique disclosed in Jpn. Pat. Appln. KOKAI Publication No. 2004-27352 described previously. In addition, no plasma damage to the substrate occurs because no plasma is used. Moreover, the copper(I) formate film 4 readily decomposes at a low temperature of about 100° C., so film formation can be performed at a temperature much lower than that of the conventional MOCVD, and the process hardly thermally deteriorates the underlying film when applied to a semiconductor device. In particular, a low-k film used as an interlayer dielectric film is weak against heat, the ability to form a film at a low temperature is extremely advantageous. Furthermore, since formic acid has a relatively high vapor pressure and so a large amount of formic acid gas can be supplied to the surface of copper oxide, it is possible to make the flow rate of copper(I) formate gas to be produced much higher than that in a method using the existing organic copper compound. This makes it possible to deposit a large amount of copper(I) formate on a substrate within a short time, thereby increasing the film formation rate.

Figure 4A:
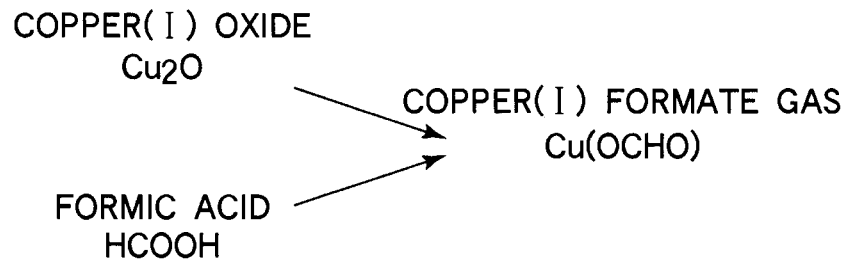
FIGS. 4A to 4C are schematic views for explaining another example of the Cu film formation method according to the typical embodiment of the present invention.
Figure 4B:
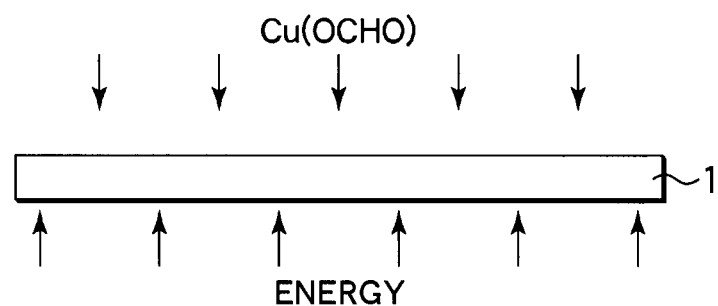
Figure 4C:
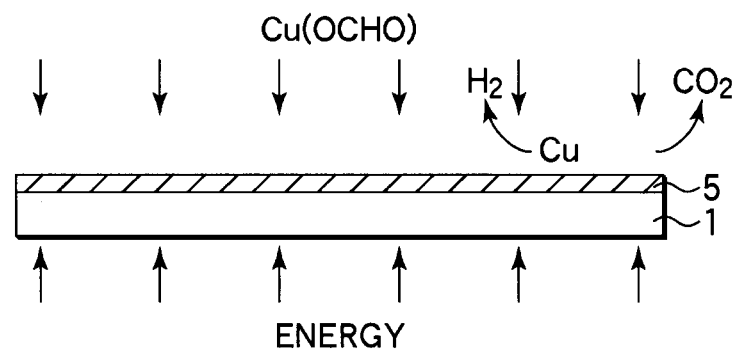

FIGS. 4A to 4C correspond to FIGS. 2A to 2C. In FIG. 4A, copper(I) formate gas is produced in the same manner as in FIG. 3A. After that, as shown in FIG. 4B, energy such as heat energy is applied to a substrate 1, e.g., the substrate 1 is heated to about 100° C. to 250° C., and the produced copper(I) formate gas is supplied onto the substrate 1. In this case, as shown in FIG. 4C, the copper(I) formate gas decomposes by the reaction of the reaction formula indicated by formula (2) before depositing on the substrate 1, thereby forming a copper film 5. This method is slightly inferior in step coverage to the method shown in FIGS. 3A to 3D, but has the merit that a metal film can be formed within a time shorter than that when forming a metal film by adsorbing carboxylate salt on the substrate surface and then applying energy as shown in FIGS. 3A to 3D.

The examples shown in FIGS. 3A to 3D and 4A to 4C use copper(I) oxide as copper oxide that is the oxygen-containing metal compound, but copper(II) oxide (CuO) can also be used. Copper(II) oxide is inferior in reactivity to copper(I) oxide but stabler than copper(I) oxide, and hence is commercially available in many forms, such as pellets and a polycrystalline plate in addition to a powder, as the processed forms of the material, and the cost is also low.

As the oxygen-containing metal compound, it is also possible to use copper(II) hydroxide ($Cu(OH)_2$) instead of copper oxide, and copper hydroxide may make it possible to decrease the temperature of the formation reaction of copper (I) formate because copper hydroxide is thermally more unstable than copper oxide.

Practical embodiments of the present invention will be explained below. The following embodiments take an example of forming copper(I) formate by using formic acid and copper(I) oxide as a typical example of forming carboxylate salt from carboxylic acid and the oxygen-containing metal compound, and will explain the case that this copper(I) formate is supplied to a semiconductor wafer as a substrate and given energy to form a copper film as a metal film.

First Embodiment

Figure 5:
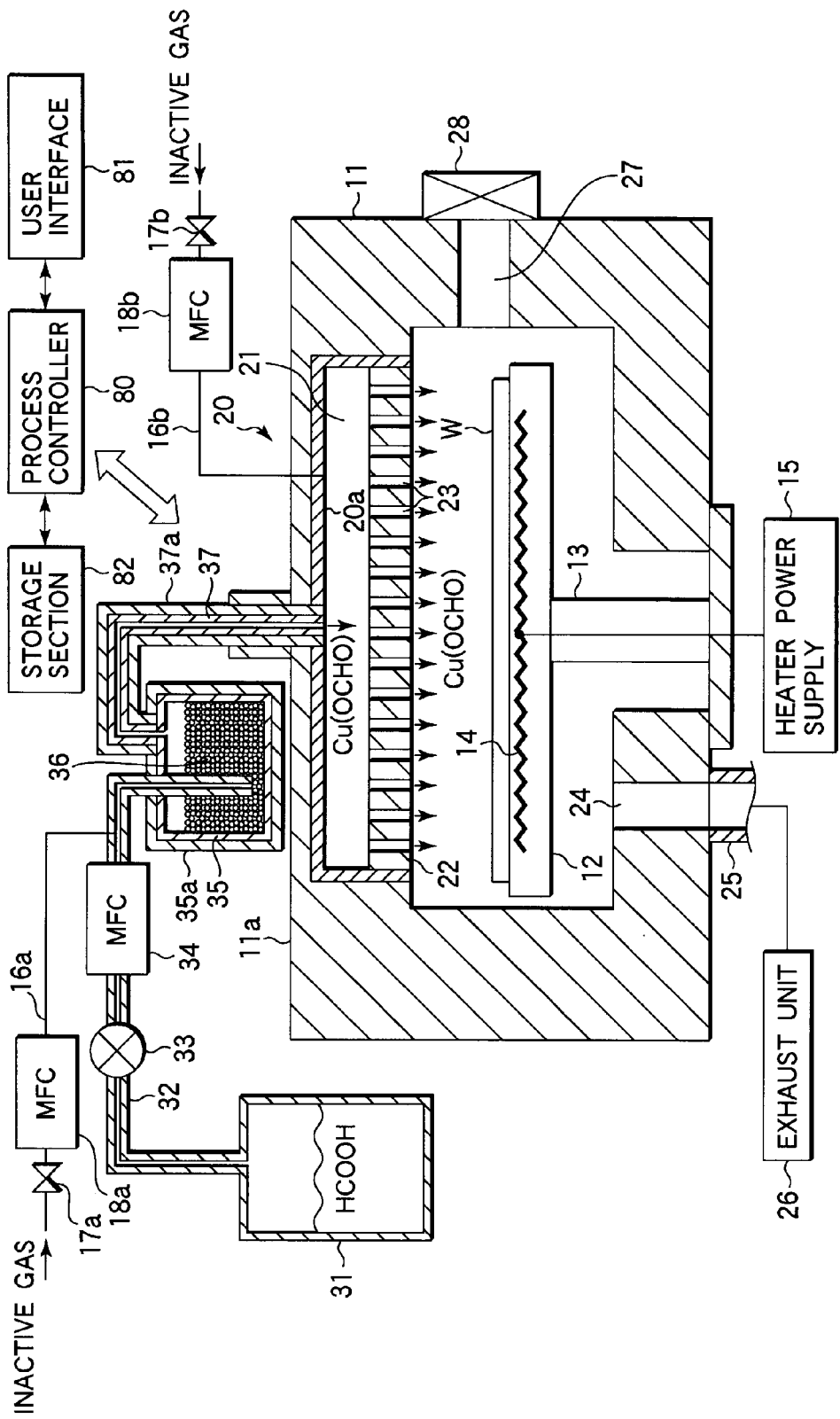
FIG. 5 is a sectional view showing an outline of the arrangement of a film formation apparatus according to a first embodiment of the present invention.

FIG. 5 is a sectional view showing an outline of the arrangement of a film formation apparatus according to a first embodiment. This film formation apparatus shown in FIG. 5 has a chamber 11 formed in a cylindrical shape or boxy shape by using aluminum or the like. Inside the chamber 11, a suscepter 12 for horizontally supporting a semiconductor wafer (to be simply referred to as a wafer hereinafter) W to be processed is placed so as to be supported by a cylindrical support member 13 disposed below the center of the suscepter 12. A heater 14 is embedded in the suscepter 12, and heats the wafer W as a target object to a predetermined temperature when supplied with power from a heater power supply 15. Note that the suscepter 12 can be made of ceramics, e.g., AlN.

A shower head 20 is disposed in a ceiling wall 11a of the chamber 11. The shower head 20 has a flat gas diffusion space 21 formed in the ceiling wall 11a of the chamber 11 and horizontally extending as a member, and a shower plate 22 disposed below the gas diffusion space 21 and having a large number of gas delivery holes 23. A heater 20a is disposed on an inner surface of the shower head 20.

An exhaust port 24 is formed in the lower portion of the sidewall of the chamber 11, and an exhaust pipe 25 is connected to the exhaust port 24. An exhaust unit 26 having a vacuum pump is connected to the exhaust pipe 25. The chamber 11 is evacuated to a predetermined vacuum degree through the exhaust pipe 25 by operating the exhaust unit 26. The sidewall of the chamber 11 has a transfer port 27 for loading/unloading the wafer W, and a gate valve 28 for opening/closing the transfer port 27.

On the other hand, a formic acid storage vessel 31 for storing formic acid (HCOOH) is placed outside the chamber 11, and a pipe 32 extends from the formic acid storage vessel 31. The pipe 32 has a valve 33 and a mass flow controller (MFC) 34 for controlling the flow rate. A reactor 35 storing a copper(I) oxide powder 36 is placed near the chamber 11, and the pipe 32 is inserted into the reactor 35. A heater 35a is disposed around the reactor 35. A pipe 37 is connected to the upper portion of the reactor 35, and extends from above the chamber 11 to a position where the pipe 37 faces the gas diffusion space 21 inside the shower head 20. A heater 37a is disposed around the pipe 37.

Formic acid in the formic acid storage vessel 31 is gasified by an appropriate means such as heating or bubbling, and this formic acid gas is supplied to the reactor 35 through the pipe 32. In the reactor 35, the copper(I) oxide powder 36 and formic acid gas react with each other as they are held at 50° C to 150° C by the heater 35a, thereby forming copper(I) formate gas in accordance with the reaction formula indicated by formula (3) described previously. Note that it is also possible to supply liquid formic acid to a vaporizer and gasify the liquid in it, or supply liquid formic acid directly to the reactor to cause the above mentioned reaction.

A gas line 16a for purging the pipe 32 with an inactive gas is connected to the pipe 32 between the mass flow controller (MFC) 34 and the reactor 35. The gas line 16a has a valve 17a and mass flow controller (MFC) 18a in this order from the upstream side. Also, a gas line 16b for purging by-products and supplying a dilute gas is connected to the gas diffusion space 21 of the shower head 20. The gas line 16b has a valve 17b and mass flow controller (MFC) 18b in this order from the upstream side.

These components constituting the film formation apparatus are connected to and controlled by a process controller 80 including a microprocessor (computer). The process controller 80 is connected to a keyboard on which a process manager or the like performs an operation of, e.g., inputting commands for managing the film formation apparatus, and a user interface 81 such as a display that visually displays the operation status of the film formation apparatus. The process controller 80 is also connected to a storage section 82 storing control programs for implementing various processes executed by the film formation apparatus under the control of the process controller 80, and programs or recipes for allowing the components of the film formation apparatus to execute processes in accordance with the process conditions. The recipes may also be stored in a hard disk or semiconductor memory, or set in a predetermined position of the storage section 82 as they are stored in a portable storage medium such as a CDROM or DVD. The recipes may also be appropriately transmitted from another apparatus through a dedicated line or the like. When required, an arbitrary recipe is called from the storage section 82 and executed by the process controller 80 by, e.g., designation from the user interface 81, thereby performing predetermined processing of the film formation apparatus under the control of the process controller 80.

A film formation process performed by using the film formation apparatus constructed as above will be explained below.

First, the gate valve 28 is opened to load the wafer W into the chamber 11 from the transfer port 27, and place the wafer W on the suscepter 12. The exhaust unit 26 evacuates the chamber 11 through the exhaust port 24 and exhaust pipe 25, thereby setting a predetermined pressure in the chamber 11.

In this state, the valve 33 is opened to supply the formic acid gas, which is adjusted to a predetermined flow rate by the mass flow controller (MFC) 34, to the reactor 35 through the pipe 32. Since the reactor 35 is heated to about 50° C. to 150° C. by the heater 35a, the copper(I) oxide powder 36 in the reactor 35 and the formic acid gas react with each other in accordance with the reaction formula indicated by formula (3) described earlier, thereby producing copper(I) formate gas. This copper(I) formate gas is supplied to the gas diffusion space 21 of the shower head 20 through the pipe 37, and delivered toward the wafer W from the large number of gas delivery holes 23 formed in the shower plate 22. In this case, the copper(I) formate gas is held at 50° C. to 150° C. by the heater 37a disposed on the outer circumferential surface of the pipe 37 and the heater 20a disposed on the inner surface of the shower head 20, and supplied in the form of a gas to the wafer W.

The copper(I) formate gas is adsorbed onto the wafer W held at a temperature from room temperature to about 50° C., and forms a copper(I) formate film as a precursor. The film thickness of this copper(I) formate film can be controlled by the supply time of the copper(I) formate gas and the wafer temperature.

When the copper(I) formate film as a precursor is formed for a predetermined time and a predetermined thickness is obtained, the supply of the copper(I) formate gas is stopped. Subsequently, the heater 14 heats the wafer W to 100° C. to 250° C. to decompose copper(I) formate by the heat energy in accordance with the reaction formula indicated by formula (2) described above, thereby forming a copper film having a predetermined thickness.

After that, the output from the heater 14 is stopped, and the gas lines are switched to the purge gas lines 16a and 16b to purge by-product gases and an extra formic acid gas by an inactive gas such as $N_2$ or Ar. Then, the internal pressure of the chamber 11 is matched with the external pressure, and the wafer W is unloaded by opening the gate valve 28.

The apparatus having the above arrangement can form a Cu film having a high step coverage and high quality at a low cost. In addition, the apparatus can form a copper film by an extremely simple method that produces copper(I) formate gas by supplying formic acid gas to the reactor 35, supplies the copper(I) formate gas thus produced into the chamber to allow the wafer W to adsorb copper(I) formate, and then heats the wafer W.

In the apparatus having the above arrangement, after the wafer W is placed on the suscepter 12 and the interior of the chamber 11 is adjusted to a predetermined pressure, it is also possible to deliver the copper(I) formate gas produced in the reactor 35 toward the wafer W by the shower head 20 while heating the wafer W to 100° C. to 250° C. by the heater 14. This makes it possible to decompose copper(I) formate in accordance with the reaction formula indicated by formula (2) described previously before copper(I) formate deposits on the wafer W, and form a copper film having a predetermined thickness on the wafer W. Accordingly, the apparatus having the above arrangement can shorten the copper film formation time.

Second Embodiment

Figure 6:
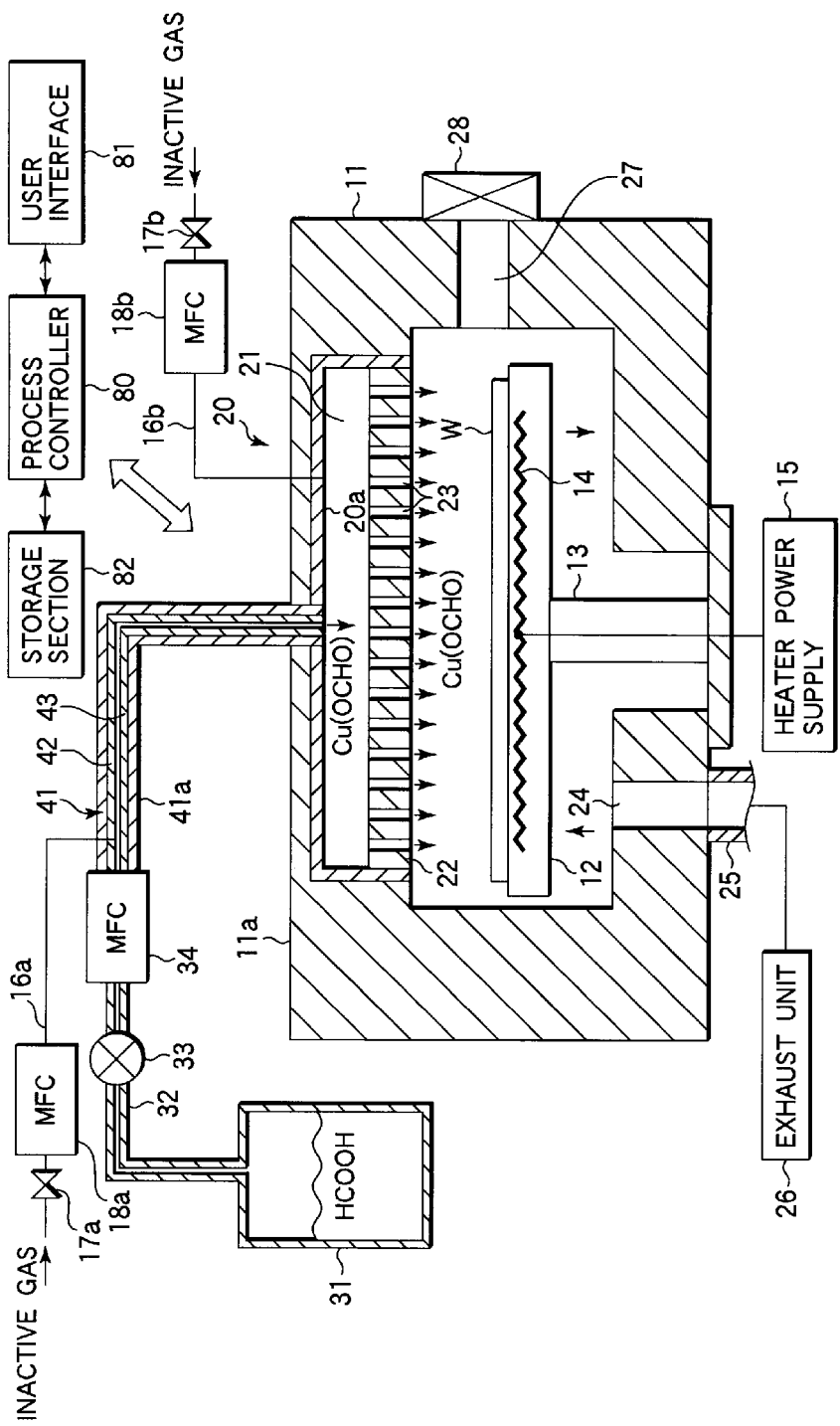
FIG. 6 is a sectional view showing an outline of the arrangement of a film formation apparatus according to a second embodiment of the present invention.

The second embodiment will be explained below. FIG. 6 is a sectional view showing an outline of the arrangement of a film formation apparatus according to a second embodiment. A mechanism for supplying copper(I) formate of this film formation apparatus differs from that shown in FIGS. 3A to 3D according to the first embodiment, and the rest of the arrangement is basically the same as the apparatus shown in FIG. 5. Therefore, the same reference numerals denote the same members, and a repetitive explanation will be omitted.

In this embodiment, a pipe 32 for supplying formic acid gas is disposed to a mass flow controller 34, and a pipe 41 having copper(I) oxide on its inner surface is disposed from the mass flow controller 34 to a portion where the pipe 41 faces a gas diffusion space 21 in a shower head 20, thereby forming copper(I) formate gas in the pipe 41. More specifically, the pipe 41 has a main body 42 made of, e.g., stainless steel, and a copper(I) oxide film 43 coated inside the main body 42. As described in, e.g., Jpn. Pat. Appln. KOKAI Publication No. 2003-282897, the copper(I) oxide film 43 can be easily formed as a dense film by performing reactive sputtering under conditions that minimize the amount of copper(II) oxide. A pipe member made of copper(I) oxide may also be used instead of forming the copper(I) oxide film 43. A heater 41a is disposed outside the pipe 41. While the formic acid gas flows through the pipe 41, therefore, the formic acid gas and copper(I) oxide film 43 react with each other as they are held at 50° C. to 150° C. in the pipe 41 by the heater 41a, thereby producing copper(I) formate gas in accordance with the reaction formula indicated by formula (3) described earlier.

The film formation apparatus of the second embodiment constructed as above is operated basically the same as the first embodiment; a wafer W is loaded into a chamber 11 and placed on a suscepter 12, the interior of the chamber 11 is held at a predetermined pressure, and a valve 33 is opened to supply formic acid gas, which is adjusted to a predetermined flow rate by the mass flow controller (MFC) 34, to the pipe 32. In this embodiment, the formic acid gas is supplied from the pipe 32 to the pipe 41. Since the pipe 41 is heated to about 50° C. to 150° C. by the heater 41a, the formic acid gas flowing through the pipe 41 reacts with the copper(I) oxide film 43 coated inside the pipe 41 in accordance with the reaction formula indicated by formula (3) described previously, thereby producing copper(I) formate gas. This copper(I) formate gas is supplied to the gas diffusion space 21 in the shower head 20 through the pipe 41, and delivered toward the wafer W from a large number of gas delivery holes 23 formed in a shower plate 22. As in the first embodiment, the copper(I) formate gas is held at 50° C. to 150° C. by the heater 20*a* and supplied in the form of a gas to the wafer W. In exactly the same manner as in the first embodiment, this copper(I) formate gas is adsorbed onto the wafer W held at a temperature from room temperature to about 50° C., and forms a solid copper(I) formate film as a precursor. Furthermore, in exactly the same way as in the first embodiment, a heater 14 heats the wafer W to 100° C. to 250° C. to decompose copper(I) formate by the heat energy in accordance with the reaction formula indicated by formula (2) described above, thereby forming a copper film having a predetermined thickness.

The apparatus of this embodiment can form a copper film by an extremely simple method by which the formic acid gas as described above flowing through the pipe 41 reacts with the copper(I) oxide film 43 to produce copper(I) formate gas, the copper(I) formate gas thus produced is supplied into the chamber to allow the wafer W to adsorb copper(I) formate, and then the wafer W is heated, and can also achieve the effects as described above.

In the apparatus of this embodiment, after the wafer W is placed on the susceptor 12 and the interior of the chamber 11 is adjusted to a predetermined pressure, it is also possible to deliver the copper(I) formate gas produced in the pipe 41 toward the wafer W by the shower head 20 while heating the wafer W to 100° C. to 250° C. by the heater 14. This makes it possible to decompose copper(I) formate in accordance with the reaction formula indicated by formula (2) described previously before copper(I) formate deposits on the wafer W, thereby forming a copper film having a predetermined thickness on the wafer W. Accordingly, the apparatus of this embodiment can also shorten the copper film formation time.

Third Embodiment

Figure 7:
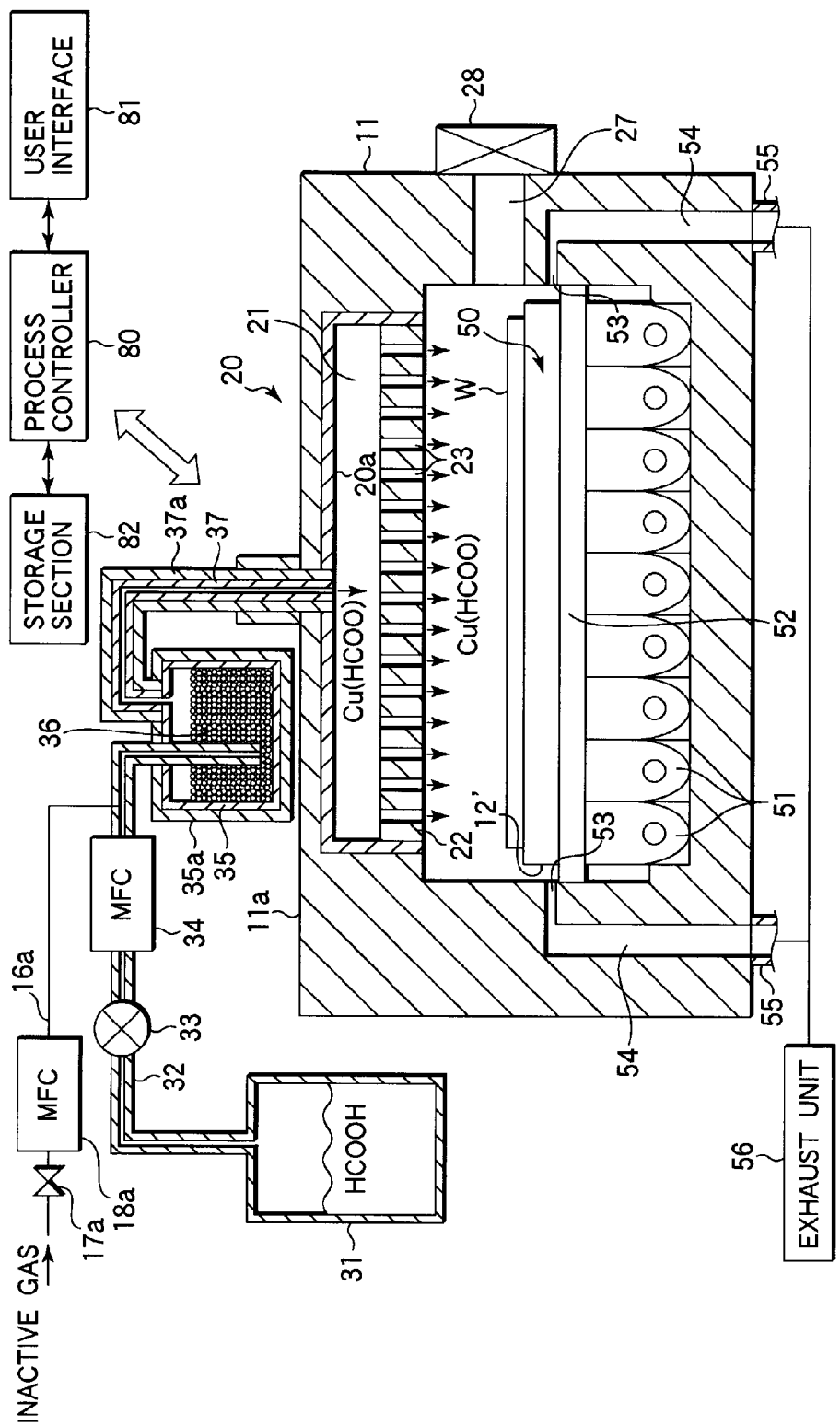
FIG. 7 is a sectional view showing an outline of the arrangement of a film formation apparatus according to a third embodiment of the present invention.

The third embodiment will be explained below. FIG. 7 is a sectional view showing an outline of the arrangement of a film formation apparatus according to a third embodiment. A mechanism for heating a wafer on a susceptor and an exhaust path of the film formation apparatus differ from FIG. 5 according to the first embodiment, and the rest of the arrangement is basically the same as the apparatus shown in FIG. 5. Therefore, the same reference numerals denote the same members, and a repetitive explanation will be omitted.

In this embodiment, a susceptor 12' having no heater is used instead of the susceptor 12, and a lamp heating unit 50 is disposed below the susceptor 12'. The lamp heating unit 50 is disposed by arraying a plurality of lamp heaters 51 that are ultraviolet lamps, and forming, on the lamp heaters 51, a transmitting window 52 made of a heat ray transmitting material such as quartz. The susceptor 12' is placed on the transmitting window 52.

Also, exhaust ports 53 are formed in the sidewall of a chamber 11 at a height corresponding to the susceptor 12', and exhaust channels 54 horizontally extend in the sidewall of the chamber 11 from the exhaust ports 53, and then extend downward from the middle portions to open in the bottom surface of the chamber 11. Exhaust pipes 55 are connected to the exhaust channels 54. An exhaust unit 56 having a vacuum pump is connected to the exhaust pipes 55. The chamber 11 is evacuated to a predetermined vacuum degree through the exhaust channels 54 and exhaust pipes 55 by operating the exhaust unit 56.

The third embodiment is also operated basically the same as the first embodiment; a wafer W is loaded and placed on the susceptor 12', the interior of the chamber 11 is held at a predetermined pressure, a valve 33 is opened to supply formic acid, which is adjusted to a predetermined flow rate by a mass flow controller (MFC) 34, to a reactor 35 through a pipe 32, and a copper(I) oxide powder 36 in the reactor 35 and the formic acid gas are reacted with each other while the interior of the reactor 35 is held at 50° C. to 150° C. by a heater 35*a*, thereby producing copper(I) formate gas. As in the first embodiment, this copper(I) formate gas is supplied to a shower head 20 through a pipe 37 and delivered toward the wafer W from delivery holes 23. The copper(I) formate gas is held at 50° C. to 150° C. by a heater 37*a* disposed on the outer circumferential surface of the pipe 37 and a heater 20*a* disposed on the inner surface of the shower head 20, and supplied in the form of a gas to the wafer W. The copper(I) formate gas delivered from the shower head 20 is adsorbed onto the wafer W to form a solid copper(I) formate film as a precursor. As in the first embodiment, the wafer on which the copper(I) formate film having a desired thickness is formed is heated to 100° C. to 250° C. to decompose copper(I) formate by the heat energy in accordance with the reaction formula indicated by formula (2) described above, thereby forming a copper film having a predetermined thickness.

In this embodiment, the lamp heating unit 50 heats the wafer W, so the heating rate after the copper(I) formate film is formed is high. Accordingly, the reaction indicated by formula (2) can be rapidly advanced, so a copper film can be formed at a high throughput by an extremely simple method.

In the apparatus of this embodiment, after the wafer W is placed on the susceptor 12' and the interior of the chamber 11 is adjusted to a predetermined pressure, it is also possible to deliver the copper(I) formate gas produced in the reactor 35 toward the wafer W by the shower head 20 while heating the wafer W to 100° C. to 250° C. by the lamp heating unit 50. This makes it possible to decompose copper(I) formate in accordance with the reaction formula indicated by formula (2) described previously before copper(I) formate deposits on the wafer W, thereby forming a copper film having a predetermined thickness on the wafer W. Accordingly, the apparatus of this embodiment can also shorten the copper film formation time.

Note that the method of forming copper(I) formate in the third embodiment may also be the same as in the second embodiment shown in FIG. 6.

Fourth Embodiment

Figure 8:
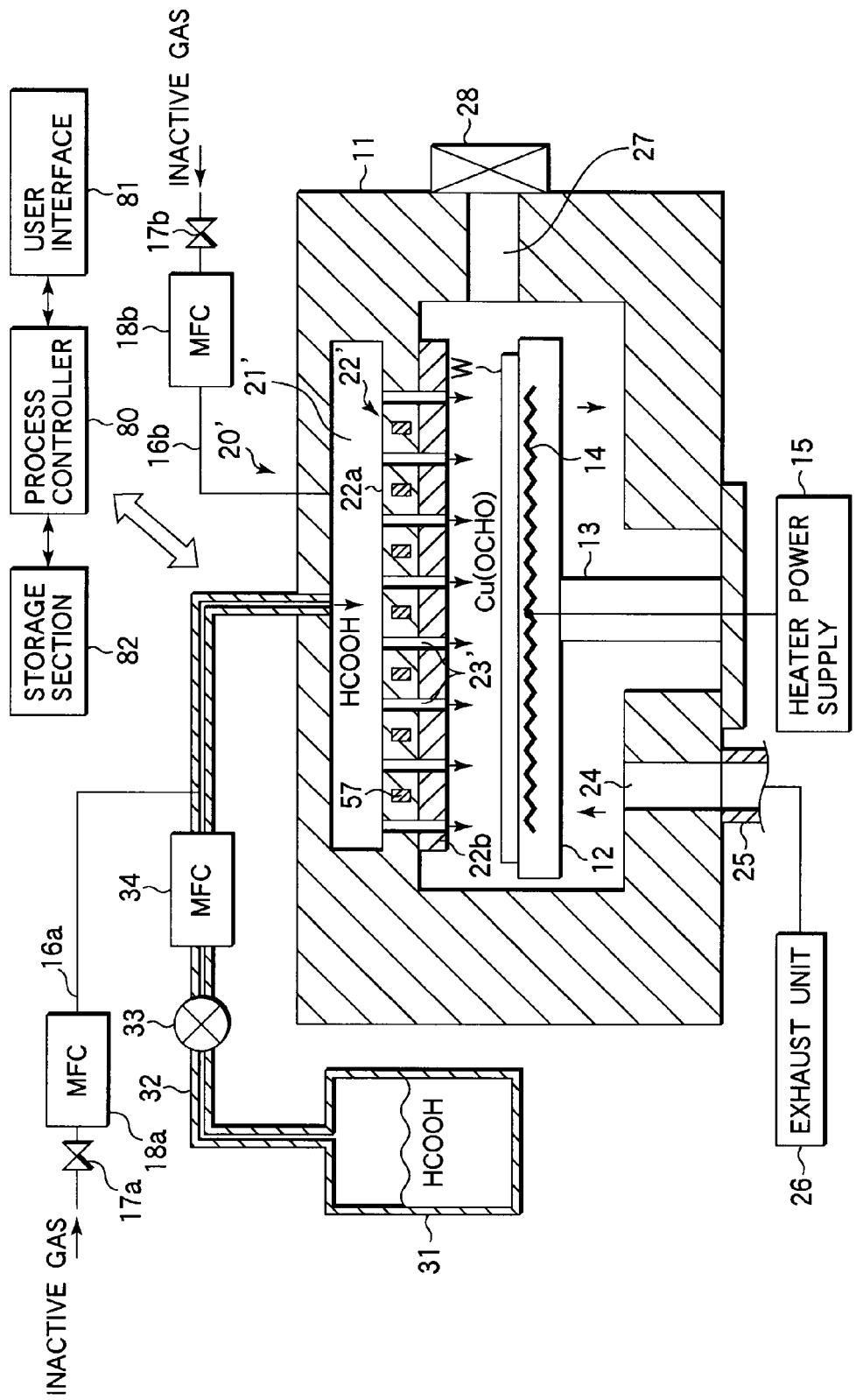
FIG. 8 is a sectional view showing an outline of the arrangement of a film formation apparatus according to a fourth embodiment of the present invention.

The fourth embodiment will be explained below. FIG. 8 is a sectional view showing an outline of the arrangement of a film formation apparatus according to a fourth embodiment. A method and mechanism for reacting formic acid with copper(I) oxide of this film formation apparatus differ from FIG. 5 according to the first embodiment, and the rest of the arrangement is basically the same as the apparatus shown in FIG. 5. Therefore, the same reference numerals denote the same members, and a repetitive explanation will be omitted.

This embodiment uses a shower head 20' instead of the shower head 20 of the first embodiment. The shower head 20' has a gas diffusion space 21', and a shower plate 22' disposed below the gas diffusion space 21' and having a structure in which a detachable copper(I) oxide-containing plate 22*b* is attached to a base plate 22*a* integrated with a chamber 11. The copper(I) oxide-containing plate 22b is partially or entirely made of copper(I) oxide. More specifically, the copper(I) oxide-containing plate 22b may be obtained by coating the surface of a base made of another material such as stainless steel with copper(I) oxide, or obtained by partially or entirely changing a copper plate into copper(I) oxide by thermally oxidizing the plate. As described previously, a copper(I) oxide coating film can be easily formed as a dense film by performing reactive sputtering under conditions that minimize the amount of copper(II) oxide. A large number of gas delivery holes 23' are formed in the shower plate 22', and plate heaters 57 are embedded in the base plate 22a.

Figure 9:
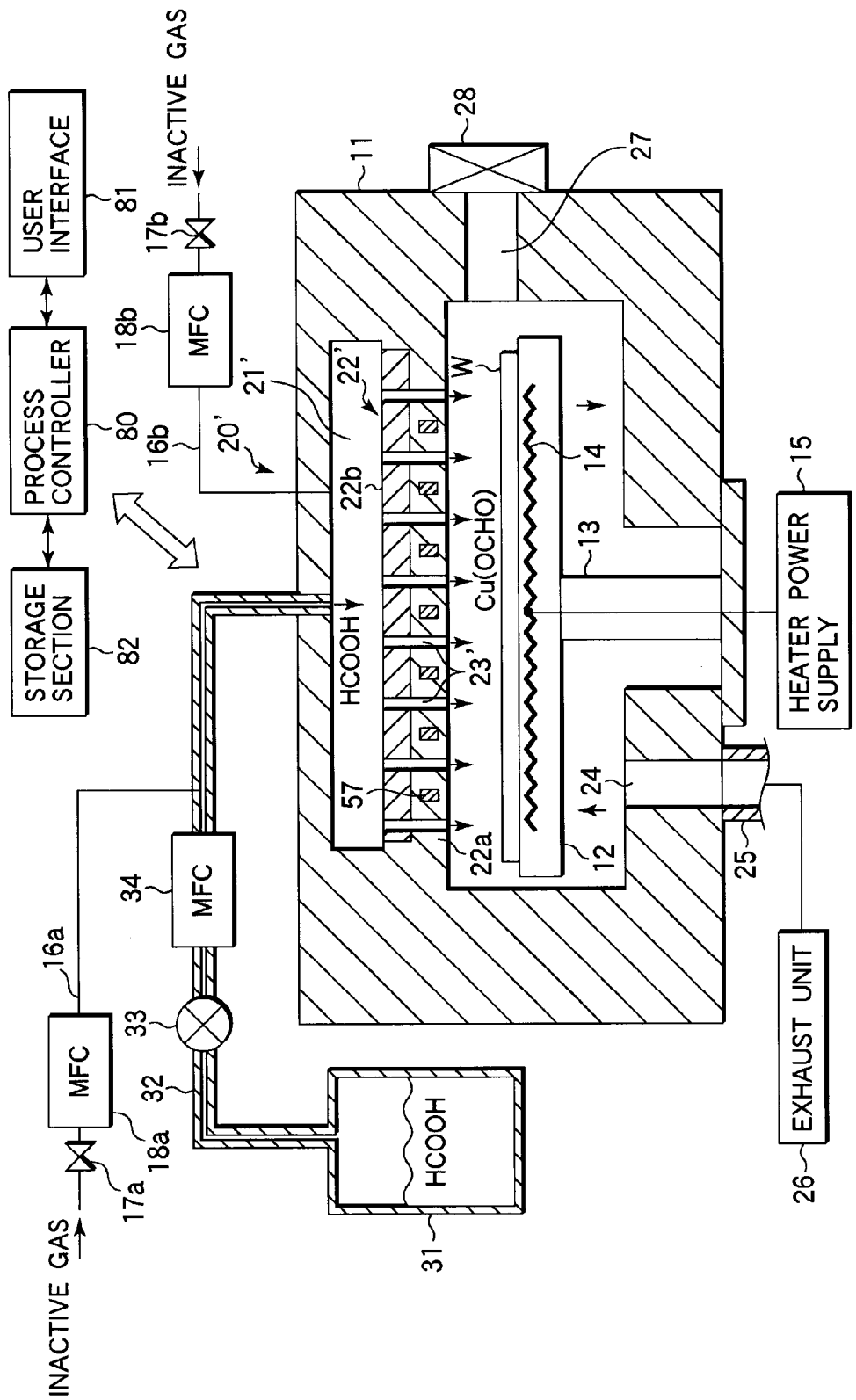
FIG. 9 is a sectional view showing a modification of the film formation apparatus shown in FIG. 8.

Note that the copper(I) oxide-containing plate 22b may also be disposed inside the base plate 22a as shown in FIG. 9.

Also, a formic acid storage vessel 31 is placed outside the chamber 11. A pipe 32 extends from the formic acid storage vessel 31 as in the apparatus shown in FIG. 5, but is directly inserted into the shower head 20' unlike in the apparatus shown in FIG. 5. That is, formic acid gas is directly supplied, without any reaction, to the gas diffusion space 21' in the shower head 20'. While the shower plate 22' is held at 50° C. to 150° C. by the plate heaters 57, the formic acid gas supplied to the gas diffusion space 21' reacts with copper(I) oxide of the copper(I) oxide-containing plate 22b while passing through the gas delivery holes 23', thereby producing copper (I) formate gas in accordance with the reaction formula indicated by formula (3) described above. This copper(I) formate gas is delivered toward the wafer W.

Note that as in the first embodiment, although formic acid in the formic acid storage vessel 31 is gasified by an appropriate means such as heating or bubbling, it is also possible to supply liquid formic acid to a vaporizer and gasify the liquid in it.

The film formation apparatus of the fourth embodiment constructed as above is operated basically the same as the first embodiment; a wafer W is loaded into the chamber 11 and placed on a susceptor 12, the interior of the chamber 11 is held at a predetermined pressure, and a valve 33 is opened to supply formic acid gas, which is adjusted to a predetermined flow rate by a mass flow controller (MFC) 34, to a pipe 32. The formic acid gas is directly supplied to the gas diffusion space 21' in the shower head 20' through the pipe 32. In this state, the plate heaters 57 heat the shower plate 22' to a temperature of 50° C. to 150° C. suitable for the formation of copper(I) formate, and the formic acid gas supplied to the gas diffusion space 21' reacts with copper(I) oxide of the copper (I) oxide-containing plate 22b while passing through the gas delivery holes 23', thereby producing copper(I) formate gas in accordance with the reaction formula indicated by formula (3) described earlier. This copper(I) formate gas is delivered toward the wafer W. In exactly the same manner as in the first embodiment, this copper(I) formate gas is adsorbed onto the wafer W held at a temperature from room temperature to about 50° C., and forms a solid copper(I) formate film as a precursor. Furthermore, in exactly the same way as in the first embodiment, a heater 14 heats the wafer W to 100° C. to 250° C. to decompose copper(I) formate by the heat energy in accordance with the reaction formula indicated by formula (2) described above, thereby forming a copper film having a predetermined thickness.

The apparatus of this embodiment can form a Cu film having a high step coverage and high quality at a low cost. In addition to this fundamental effect, the apparatus can form a copper film by an extremely simple method in which when the formic acid gas is directly supplied to the shower head 20' and delivered from the gas delivery holes 23', formic acid and copper(I) oxide of the copper(I) oxide-containing plate 22b react with each other to produce copper(I) formate gas, and the wafer W adsorbs copper(I) formate immediately after that and is heated. In addition, since the length of the path that transports the produced copper(I) formate gas to the surface of the wafer W is very short, it is possible to evenly supply the copper(I) formate gas that is thermally unstable to the surface of the wafer W without decomposing the gas.

In the apparatus of this embodiment, after the wafer W is placed on the susceptor 12 and the interior of the chamber 11 is adjusted to a predetermined pressure, the copper(I) formate gas produced by reacting the formic acid gas with copper(I) oxide of the copper(I) oxide-containing plate 22b may also be delivered toward the wafer W while the wafer W is heated to 100° C. to 250° C. by the heater 14. This makes it possible to decompose copper(I) formate in accordance with the reaction formula indicated by formula (2) described previously before copper(I) formate deposits on the wafer W, thereby forming a copper film having a predetermined thickness on the wafer W. Accordingly, the apparatus of this embodiment can also shorten the copper film formation time.

Note that the apparatus can also include the heating lamp unit 50 as shown in FIG. 7, instead of the heater 14, as a susceptor heating means.

Fifth Embodiment

Figure 10:
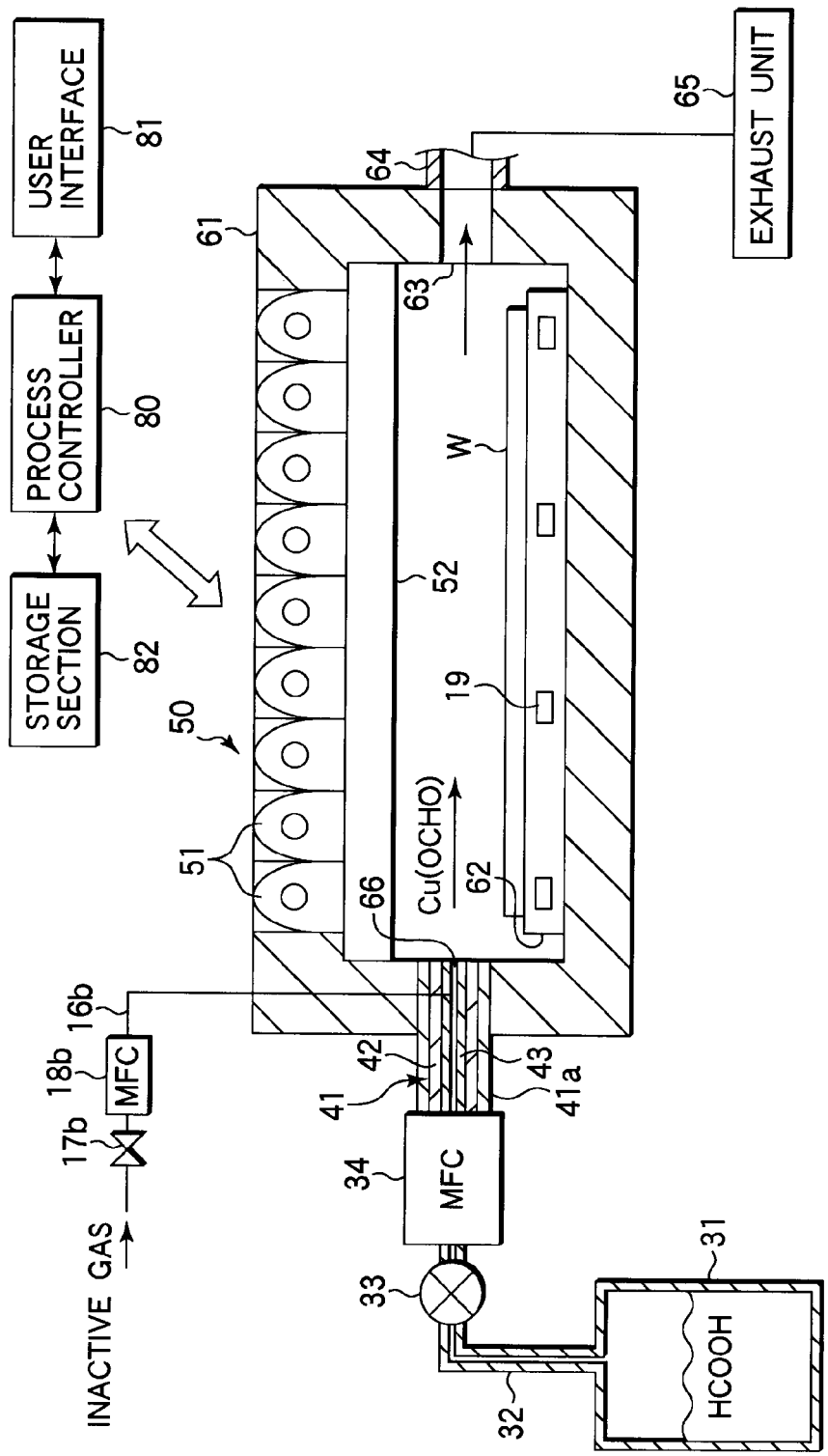
FIG. 10 is a sectional view showing an outline of the arrangement of a film formation apparatus according to a fifth embodiment of the present invention.

The fifth embodiment will be explained below. FIG. 10 is a sectional view showing an outline of the arrangement of a film formation apparatus according to a fifth embodiment. This film formation apparatus shown in FIG. 10 has a flat chamber 61 made of the same material as the chamber 11 shown in FIG. 5. A susceptor 62 on which a wafer W is placed is disposed on the bottom of the chamber 61. The susceptor 62 is made of the same material as the susceptor 12, and has refrigerant channels 19 for temperature control.

Similar to the third embodiment shown in FIG. 7, the ceiling wall of the chamber 61 has a lamp heating unit 50 including a plurality of lamp heaters 51 and a transmitting window 52. The lamp heating unit 50 is disposed with the transmitting window 52 facing down so as to emit heat rays downward.

A gas supply port 66 is formed in the sidewall of the chamber 61, and copper(I) formate gas is supplied from the gas supply port 66. Also, similar to the second embodiment, a pipe 32 is disposed from a formic acid storage vessel 31 to a mass flow controller 34, and a pipe 41 having a main body 42 and a copper(I) oxide film 43 coated inside the main body 42 is disposed from the mass flow controller 34 to the gas supply port 66 of the chamber 61. A heater 41a disposed outside the pipe 41 heats the interior of the pipe 41 to 50° C. to 150° C. suitable for the formation of copper(I) formate gas. Therefore, formic acid gas and the copper(I) oxide film 43 react with each other as they are held at 50° C. to 150° C. in the pipe 41, thereby producing copper(I) formate gas in accordance with the reaction formula indicated by formula (3) described above. This copper(I) formate gas is supplied from the gas supply port 66 into the chamber 61.

An exhaust port 63 is formed in that portion of the sidewall of the chamber 61 which is opposite to the gas supply port 66, and an exhaust pipe 64 is connected to the exhaust port 63. An exhaust unit 65 having a vacuum pump is connected to the exhaust pipe 64. The chamber 61 is evacuated to a predetermined vacuum degree through the exhaust pipe 64 by operating the exhaust unit 65.

In the film formation apparatus constructed as above, the wafer W is loaded into the chamber 61 by opening a gate valve (not shown), and placed on the susceptor 62. The susceptor 62 is already held at a temperature of about −30° C. to 50° C. by a refrigerant flowing through the refrigerant channels 19. The exhaust unit 65 evacuates the chamber 61 through the exhaust port 63 and exhaust pipe 64, thereby setting a predetermined pressure in the chamber 61. Then, a valve 33 is opened to supply formic acid gas, which is adjusted to a predetermined flow rate by the mass flow controller (MFC) 34, to the pipe 32. In this embodiment, the formic acid gas is supplied from the pipe 32 to the pipe 41. Since the pipe 41 is heated to about 50° C. to 150° C. by the heater 41*a*, the formic acid gas flowing through the pipe 41 reacts with the copper(I) oxide film 43 coated inside the pipe 41 in accordance with the reaction formula indicated by formula (3) described previously, thereby producing copper(I) formate gas. This copper(I) formate gas is supplied from the pipe 41 to the chamber 61 through the gas supply port 66, and flows to the exhaust port 63 along the surface of the wafer W. During this process, copper(I) formate is adsorbed onto the wafer W held at −30° C. to 50° C. to form a solid copper(I) formate film as a precursor. After that, the lamp heaters 51 of the lamp heating unit 50 are turned on to heat the wafer W to 100° C. to 250° C. to decompose copper(I) formate in accordance with the reaction formula indicated by formula (2) described above, thereby forming a copper film having a predetermined thickness.

The apparatus of this embodiment can be made compact because a gas is supplied from the sidewall and exhausted from the opposite sidewall. In addition, since energy is supplied by directly emitting the lamp light to copper(I) formate, copper(I) formate can react much faster than a method that indirectly supplies energy by heat conduction by heating the rear surface of the wafer or suscepter. Also, a method that directly applies energy from above can use a cooling mechanism such as the suscepter 62 because no heating mechanism need be disposed at the back of the wafer W. Since the amount of adsorption of copper(I) formate gas to the surface of the wafer W increases as the temperature decreases, this method is more advantageous than the first to fourth embodiments described above.

In the apparatus of this embodiment, after the wafer W is placed on the suscepter 62 and the interior of the chamber 61 is adjusted to a predetermined pressure, it is also possible to supply the copper(I) formate gas produced in the pipe 41 from the gas supply port 66 toward the wafer W in the chamber 61 while heating the wafer W to 100° C. to 250° C. by the lamp heating unit 50. This makes it possible to decompose copper (I) formate in accordance with the reaction formula indicated by formula (2) described previously before copper(I) formate deposits on the wafer W, thereby forming a copper film having a predetermined thickness on the wafer W. Accordingly, the apparatus of this embodiment can also shorten the copper film formation time.

Note that similar to the first embodiment, the copper(I) formate formation method may also use a reactor storing powdery copper(I) oxide.

Sixth Embodiment

Figure 11:
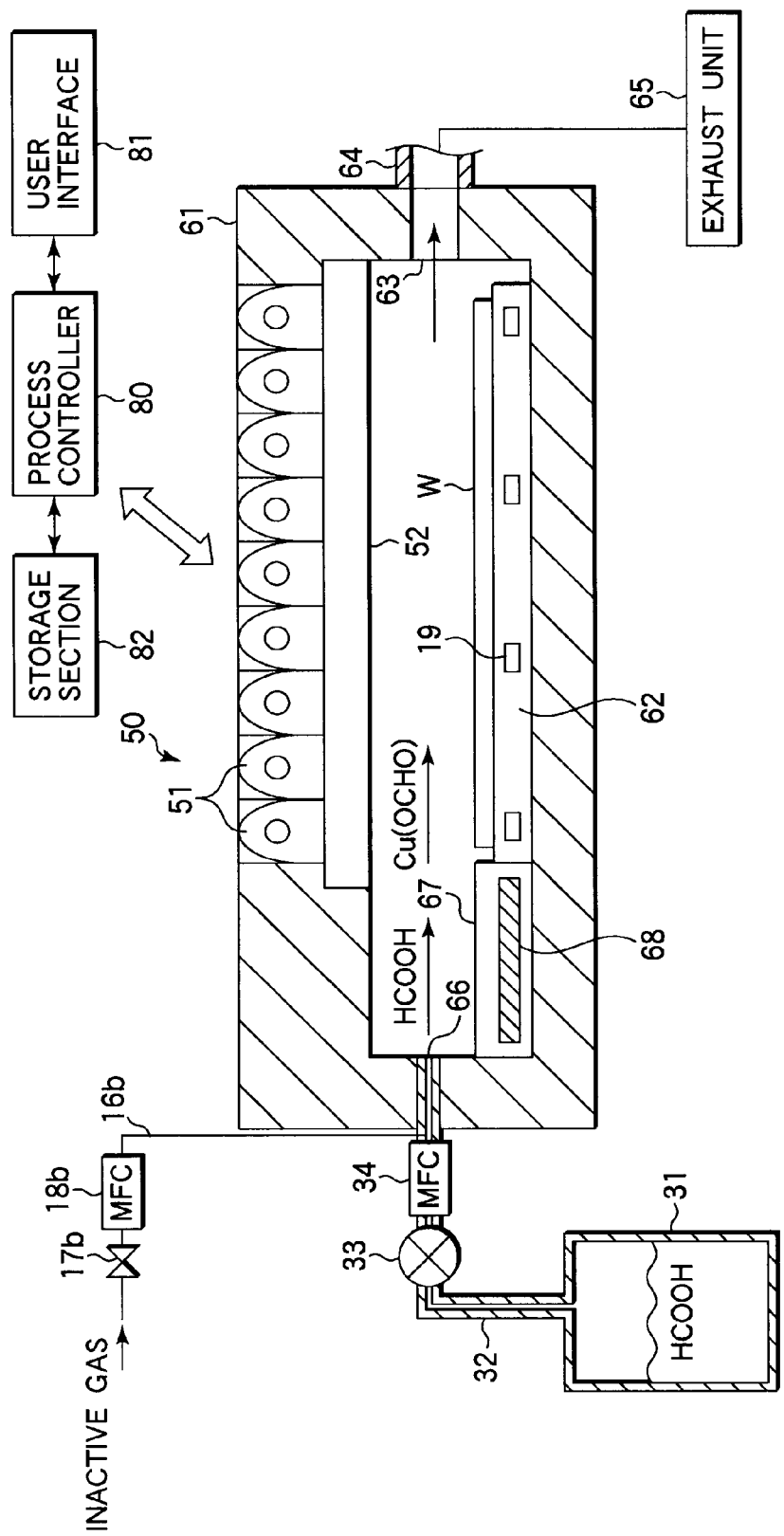
FIG. 11 is a sectional view showing an outline of the arrangement of a film formation apparatus according to a sixth embodiment of the present invention.

The sixth embodiment will be explained below. FIG. 11 is a sectional view showing an outline of the arrangement of a film formation apparatus according to a sixth embodiment. This film formation apparatus is basically the same as the apparatus of the fifth embodiment shown in FIG. 10 except that formic acid is directly supplied from a formic acid storage vessel 31 to a chamber 61 through a pipe 32 and copper(I) formate is produced in the chamber 61. That is, the pipe 32 extends to a gas supply port 66 of the chamber 61, and a copper(I) oxide-containing member 67 is placed near the gas supply port 66 in the chamber 61. At least the surface of the copper(I) oxide-containing member 67 is made of copper(I) oxide. More specifically, the copper(I) oxide-containing member 67 may be obtained by coating the surface of a base made of another material such as stainless steel with copper (I) oxide, or obtained by changing at least the surface portion of a copper plate into copper(I) oxide by thermal oxidation. A heater 68 is embedded in the copper(I) oxide-containing member 67, so the copper(I) oxide-containing member 67 can be held at 50° C. to 150° C. suited to the formation of copper (I) formate.

In the film formation apparatus constructed as above, as in the fifth embodiment, a wafer W is loaded into the chamber 61, placed on a suscepter 62, and held at a predetermined temperature, and the interior of the chamber 61 is set at a predetermined pressure. Then, a valve 33 is opened to supply formic acid gas, which is adjusted to a predetermined flow rate by a mass flow controller (MFC) 34, into the chamber 61 through the pipe 32. This formic acid gas supplied into the chamber 61 flows along the copper(I) oxide-containing member 67 disposed near the gas supply port 66. Since the copper (I) oxide-containing member 67 is heated to about 50° C. to 150° C. by the heater 68, the formic acid gas reacts with copper(I) oxide of the copper(I) oxide-containing member 67 in accordance with the reaction formula indicate by formula (3) described earlier, thereby producing copper(I) formate gas. This copper(I) formate gas is adsorbed onto the wafer W held at −30° C. to 50° C. while flowing along the surface of the wafer W, thereby forming a solid copper(I) formate film as a precursor. After that, in the same manner as in the fifth embodiment, lamp heaters 51 of a lamp heating unit 50 are turned on to heat the wafer W to 100° C. to 250° C. to decompose copper(I) formate by the heat energy in accordance with the reaction formula indicated by formula (2) described previously, thereby forming a copper film having a predetermined thickness.

The apparatus of this embodiment can achieve the same effects as in the fifth embodiment, and can also suppress the deterioration of chemically unstable copper(I) formate gas because the copper(I) formate gas is produced immediately before the wafer W.

In the apparatus of this embodiment, after the wafer W is placed on the suscepter 62 and the interior of the chamber 61 is adjusted to a predetermined pressure, it is also possible to supply the formic acid gas from the gas supply port 66 into the chamber 61 while heating the copper(I) oxide-containing member 67 to about 50° C. to 150° C. by the heater 68 and heating the wafer W to 100° C. to 250° C. by the lamp heating unit 50. Consequently, copper(I) formate produced by reacting the formic acid gas with copper(I) oxide of the copper(I) oxide-containing member 67 in accordance with the reaction formula indicated by formula (3) described above can be decomposed in accordance with the reaction formula indicated by formula (2) described above before copper(I) formate deposits on the wafer W, thereby forming a copper film having a predetermined thickness on the wafer W. Accordingly, the apparatus of this embodiment can also shorten the copper film formation time.

Seventh Embodiment

Figure 12:
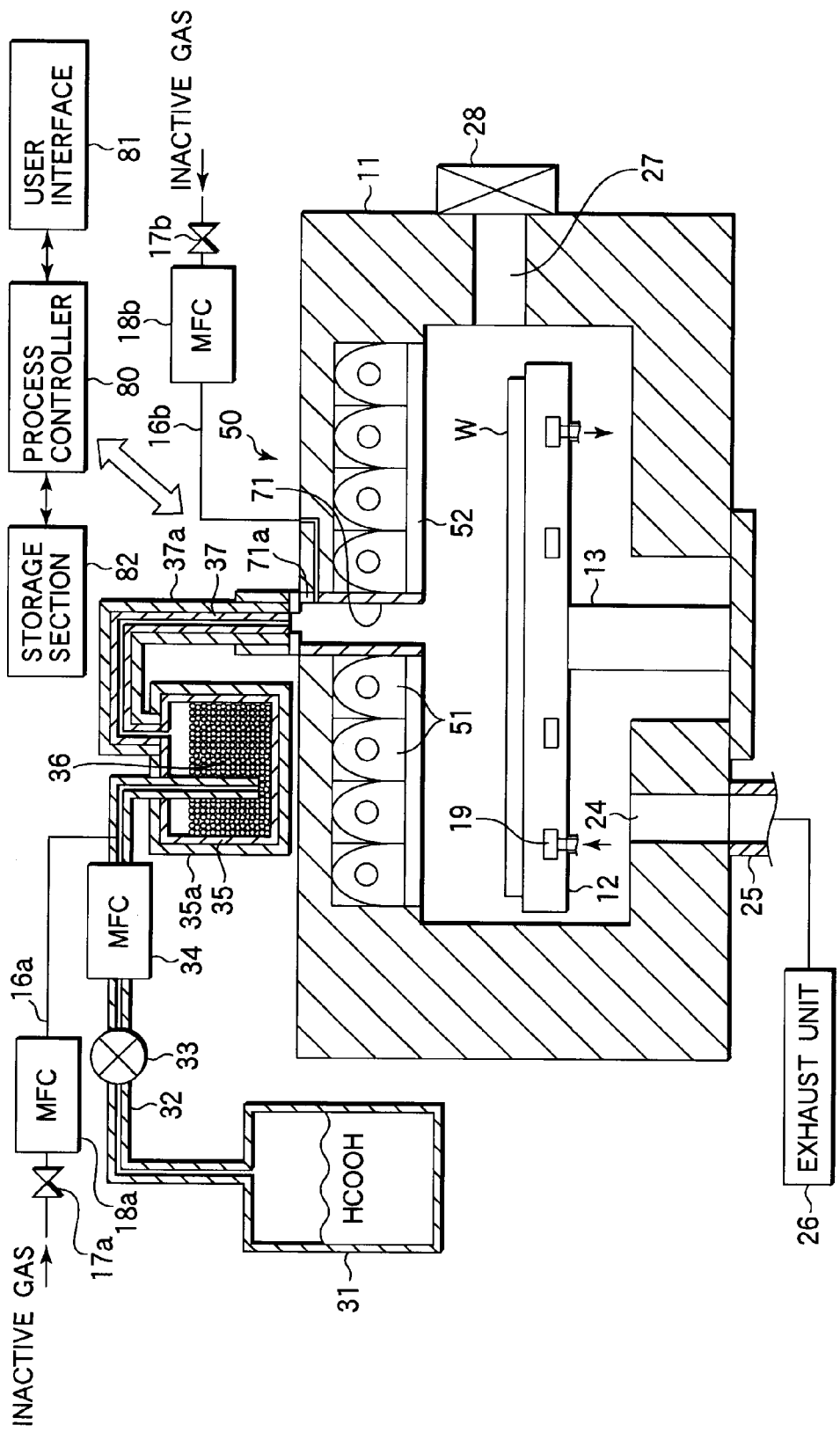
FIG. 12 is a sectional view showing an outline of the arrangement of a film formation apparatus according to a seventh embodiment of the present invention.

The seventh embodiment will be explained below. FIG. 12 is a sectional view showing an outline of the arrangement of a film formation apparatus according to a seventh embodiment. This film formation apparatus shown in FIG. 12 is obtained by disposing a lamp heating unit 50 in the upper portion of a chamber 11 instead of disposing a heater in a suscepter 12, forming a gas supply port 71 in the ceiling wall of the chamber 11 instead of disposing a shower head, and disposing a heater 71a on the inner surface of the gas supply port 71, in the film formation apparatus shown in FIG. 5 according to the first embodiment. The rest of the arrangement is basically the same as FIG. 5, so the same reference numerals as in FIG. 5 denote the same parts, and a repetitive explanation will be omitted.

The film formation apparatus of the seventh embodiment constructed as above is operated basically the same as the first embodiment; a wafer W is loaded into the chamber 11 and placed on the suscepter 12, the interior of the chamber 11 is held at a predetermined pressure, and a valve 33 is opened to supply formic acid gas, which is adjusted to a predetermined flow rate by a mass flow controller (MFC) 34, to a reactor 35 through a pipe 32. Since the reactor 35 is heated to about 50° C. to 150° C. by a heater 35a, a copper(I) oxide powder 36 in the reactor 35 and the formic acid gas react with each other in accordance with the reaction formula indicated by formula (3) described above, thereby producing copper(I) formate gas. This copper(I) formate gas is supplied into the chamber 11 through a pipe 37 and the gas supply port 71. In this case, the copper(I) formate gas is held at 50° C. to 150° C. by a heater 37a of the pipe 37 and the heater 71a of the gas supply port 71, and supplied in the form of a gas to the wafer W. The copper(I) formate gas comes in contact with the wafer W held at a temperature of about −30° C. to 50° C., and is adsorbed onto the wafer W. Accordingly, a solid copper(I) formate film having a predetermined thickness is formed by supplying the copper(I) formate gas for a predetermined time.

After that, the lamp heating unit 50 heats the wafer W to decompose copper(I) formate by the heat energy in accordance with the reaction of the reaction formula indicated by formula (2), thereby forming a copper film having a predetermined thickness.

This arrangement may slightly decrease the uniformity of gas supply because no shower head is disposed. Since copper (I) formate is decomposed by lamp heating from above, however, it is possible to heat the wafer W faster than the apparatus shown in FIG. 7 in which the lamp heating unit is disposed below the suscepter 12, and further increase the throughput. As in the fifth embodiment, a cooling mechanism can be disposed in the suscepter 12 because no heating mechanism is disposed in it. Since the amount of adsorption of the copper(I) formate gas to the surface of the wafer W increases as the temperature decreases, this method is more advantageous than the first to fourth embodiments described above.

In the apparatus of this embodiment, after the wafer W is placed on the suscepter 12 and the interior of the chamber 11 is adjusted to a predetermined pressure, it is also possible to supply the copper(I) formate gas produced in the reactor 35 from the gas supply port 71 toward the wafer W while heating the wafer W to 100° C. to 250° C. by the lamp heating unit 50. This makes it possible to decompose copper(I) formate in accordance with the reaction formula indicated by formula (2) described previously before copper(I) formate deposits on the wafer W, thereby forming a copper film having a predetermined thickness on the wafer W. Accordingly, the apparatus of this embodiment can also shorten the copper film formation time.

Note that in this embodiment, copper(I) formate can be formed by reacting formic acid with a copper(I) oxide film formed inside a pipe as in the apparatus shown in FIG. 6, or by setting a copper(I) oxide-containing member in the chamber 11 and reacting this member with formic acid supplied into the chamber 11.

Eighth Embodiment

Each of the first to seventh embodiments has disclosed an example in which both the copper(I) oxide adsorption step and the copper film formation step by heating are performed in one chamber. This embodiment will disclose an example in which different chambers perform these steps and apparatuses are clustered, in order to increase the throughput and the degree of flexibility of processing.

Figure 13:
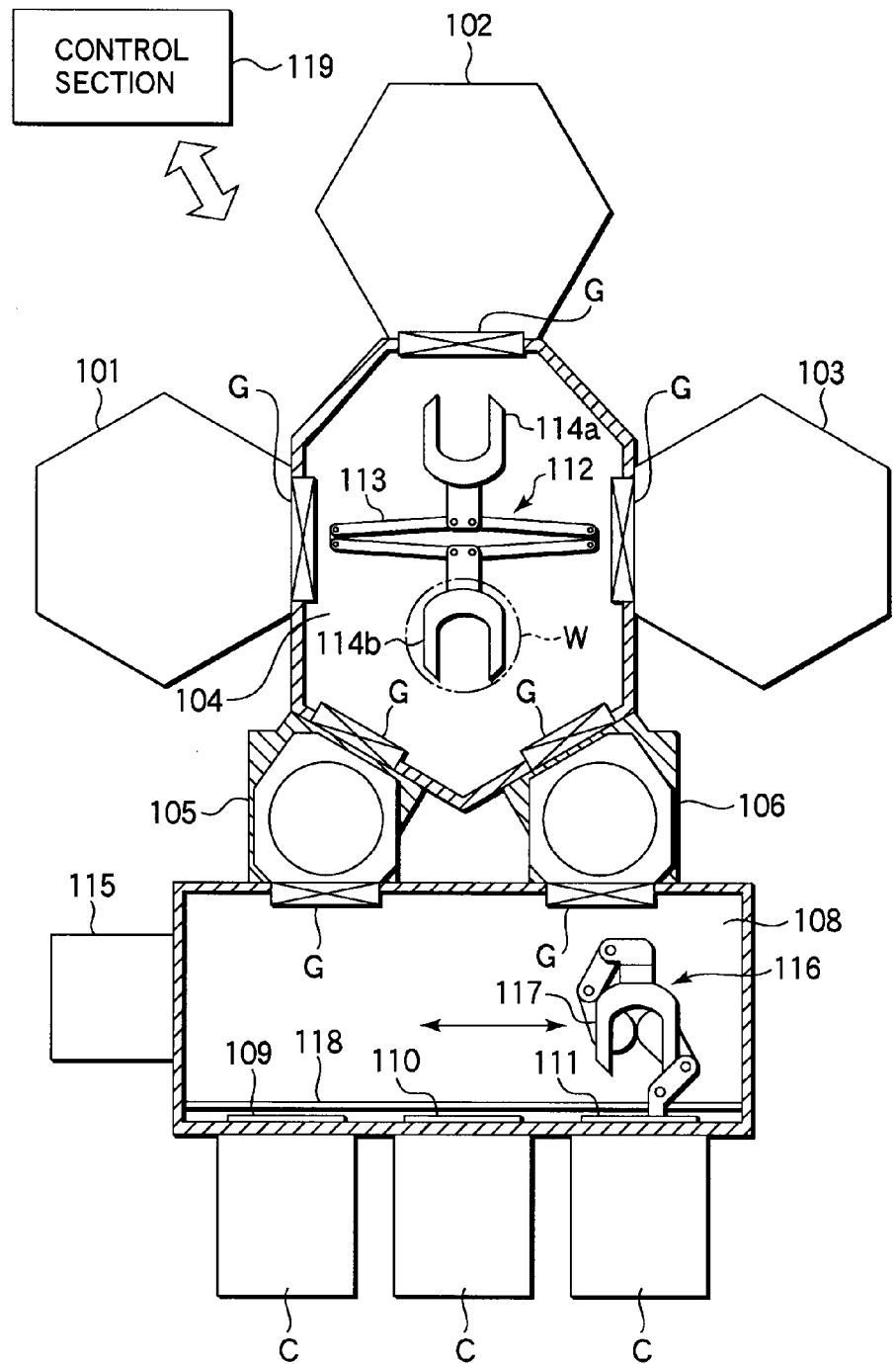
FIG. 13 is a plan view showing an outline of the arrangement of a system according to an eighth embodiment of the present invention.

FIG. 13 is a plan view showing an outline of the structure of a clustered system. This system comprises an adsorption processing unit 101 that allows a wafer W to adsorb copper(I) formate, an annealing unit 102 that forms a copper film by decomposing copper(I) formate adsorbed onto the wafer W by applying heat energy to copper(I) formate by annealing the wafer W, and a cooling unit 103 that cools the annealed wafer W. These units are disposed to correspond to three sides of a heptagonal wafer transfer chamber 104. Also, load-lock chambers 105 and 106 are disposed on two other sides of the wafer transfer chamber 104. A wafer I/O chamber 108 is disposed on the side of the load-lock chambers 105 and 106 away from the wafer transfer chamber 104. Ports 109, 110, and 111 to which three carriers C capable of containing wafers W are formed on the side of the wafer I/O chamber 108 away from the load-lock chambers 105 and 106.

As shown in FIG. 13, the adsorption processing unit 101, annealing unit 102, cooling unit 103, and load-lock chambers 105 and 106 are connected to the corresponding sides of the wafer transfer chamber 104 via gate valves G, allowed to communicate with the wafer transfer chamber 104 by opening the corresponding gate valves G, and isolated from the wafer transfer chamber 104 by closing the corresponding gate valves G. Gate valves G are also disposed in the portions where the load-lock chambers 105 and 106 are connected to the wafer I/O chamber 108. The load-lock chambers 105 and 106 are allowed to communicate with the wafer I/O chamber 108 by opening the corresponding valves G, and isolated from the wafer I/O chamber 108 by closing the corresponding valves G.

In the wafer transfer chamber 104, a wafer transfer device 112 for loading/unloading the wafer W with respect to the adsorption processing unit 101, annealing unit 102, cooling unit 103, and load-lock chambers 105 and 106 is disposed. The wafer transfer device 112 is positioned in almost the center of the wafer transfer chamber 104, and has two blades 114a and 114b for holding the wafer W at the ends of a rotating/expanding member 113 that can rotate and expand. The two blades 114a and 114b are attached to the rotating/expanding member 113 so as to point in opposite directions. Note that the interior of the wafer transfer chamber 104 is held at a predetermined vacuum degree.

The three ports 109, 110, and 111 for attaching the carriers C of the wafer I/O chamber 108 have shutters (not shown), and the carrier C that contains the wafers W or is empty is directly attached to each port. An alignment chamber 115 is disposed on the side surface of the wafer I/O chamber 108, and aligns the wafers W.

In the wafer I/O chamber 108, a wafer transfer device 116 for loading/unloading the wafer W with respect to the carriers C and loading/unloading the wafer W with respect to the load-lock chambers 105 and 106 is disposed. The wafer transfer device 116 has a multijoint arm structure, and can run on rails 118 along the direction in which the carries C are arrayed. The wafer transfer device 116 transfers the wafer W by placing it on a hand 117 at the end of the wafer transfer device 116. A control section 119 controls the overall system, e.g., the operations of the wafer transfer devices 112 and 116. The control section 119 has the functions of the process controller 80, user interface 81, and storage section 82 described previously.

As the adsorption processing unit 101, it is basically possible to use a unit having an arrangement obtained by removing the heating means from the apparatuses of the first to seventh embodiments.

Figure 14:
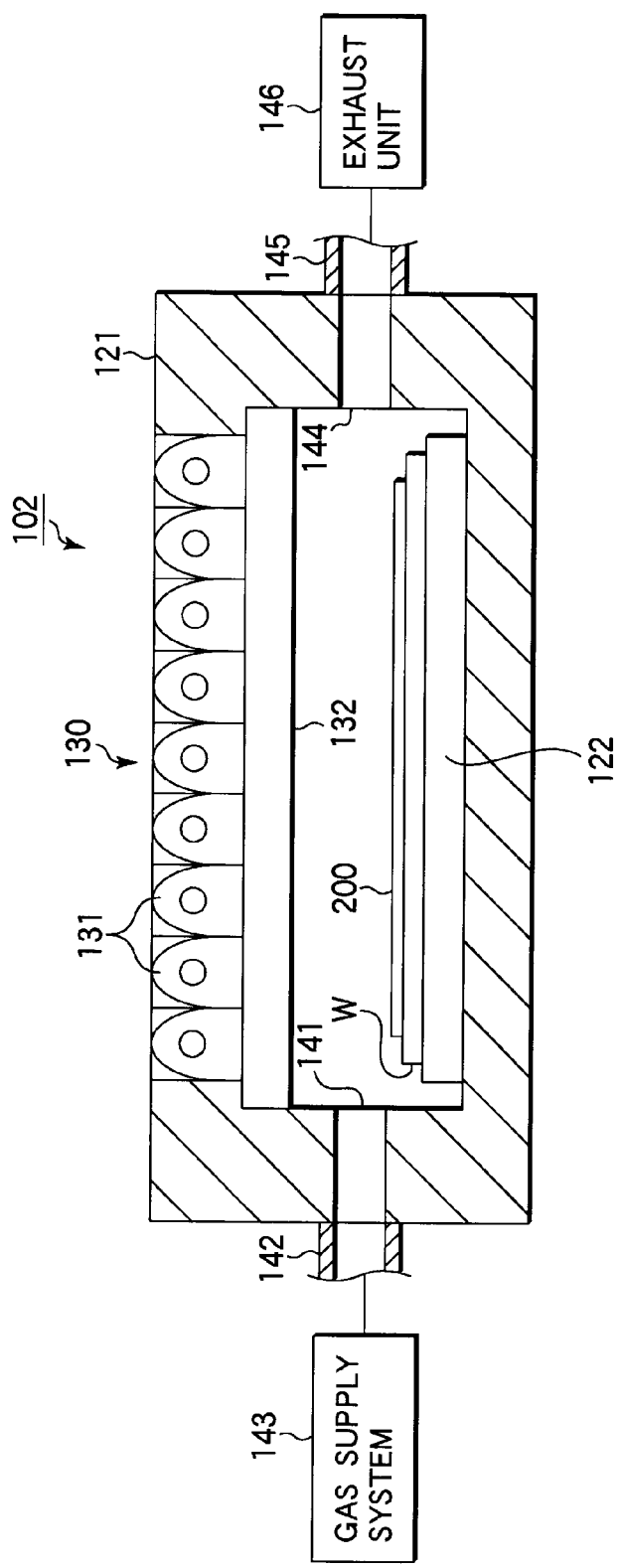
FIG. 14 is a sectional view showing an annealing unit used in the system shown in FIG. 13.

Although the annealing unit 102 need only be a unit capable of heating the wafer W, a unit shown in FIG. 14 can be suitably used. The annealing unit 102 has a flat chamber 121 similar to the chamber 61 of the apparatus shown in FIG. 10, and a suscepter 122 on which the wafer W having a copper(I) formate film 200 is placed is disposed on the bottom of the chamber 121.

The ceiling wall of the chamber 121 has a lamp heating unit 130 comprising a plurality of lamp heaters 131 that are ultraviolet lamps, and a transmitting window 132. The lamp heating unit 130 is disposed with the transmitting window 132 facing down so as to emit heat rays downward.

A gas supply port 141 is formed in the sidewall of the chamber 121, and a gas supply pipe 142 is connected to the gas supply port 141. The gas supply pipe 142 is connected to a gas supply mechanism 143 that supplies an inactive gas such as $N_2$ gas, Ar gas, or He gas.

An exhaust port 144 is formed in that portion of the sidewall of the chamber 121 which is opposite to the gas supply port 141, and an exhaust pipe 145 is connected to the exhaust port 144. An exhaust unit 146 having a vacuum pump is connected to the exhaust pipe 145. The chamber 121 is evacuated to a predetermined vacuum degree through the exhaust pipe 145 by operating the exhaust unit 146.

Since this apparatus can perform rapid heating by lamp heating and rapid cooling by the inactive gas, it is possible to perform extremely rapid annealing and increase the throughput. Also, this unit is a module for annealing only, so the degree of flexibility of processing is high. For example, it is readily possible to reduce carbon and oxygen in a film by performing annealing at a temperature higher than the Cu film formation wafer temperature.

Although not shown, the cooling unit 103 has a simple arrangement in which a cooling stage having refrigerant channels is placed in a chamber, and cools the wafer W heated to a high temperature by annealing.

In the system constructed as above, the wafer transfer device 116 unloads the wafer W from one of the carriers C and loads the wafer W into the load-lock chamber 105, and the wafer transfer device 112 transfers the wafer W from the load-lock chamber 105 to the transfer chamber 104. The wafer W is first transferred to the adsorption processing unit 101, and a copper(I) formate adsorption process is performed. The wafer transfer device 112 unloads, from the adsorption processing unit 101, the wafer W on which a copper(I) formate film having a predetermined thickness is formed in the adsorption processing unit 101, and successively loads the wafer W into the annealing unit 102. The annealing unit 102 forms a copper film by decomposing a copper(I) oxide film by lamp heating. After that, the wafer transfer device 112 unloads the wafer W on which the copper film is formed from the annealing unit 102, and successively loads the wafer W into the cooling unit 103. The cooling unit 103 cools the wafer W to a predetermined temperature on the wafer stage. The wafer transfer device 112 transfers the wafer W cooled in the cooling unit 103 to the load-lock chamber 106, and the wafer transfer device 116 loads the wafer W into a predetermined carrier C from the load-lock chamber 106. A series of processes as described above are successively performed on the wafers W contained in the carrier C.

By performing the individual steps in different apparatuses and clustering these apparatuses as described above, each apparatus can exclusively perform predetermined processing. This makes it possible to increase the throughput compared to the case that one apparatus performs all steps.

Note that a unit for performing the copper film formation process according to the embodiment of the present invention and another unit for sputtering or the like may also be clustered in the same manner as shown in FIG. 13.

Figure 15:
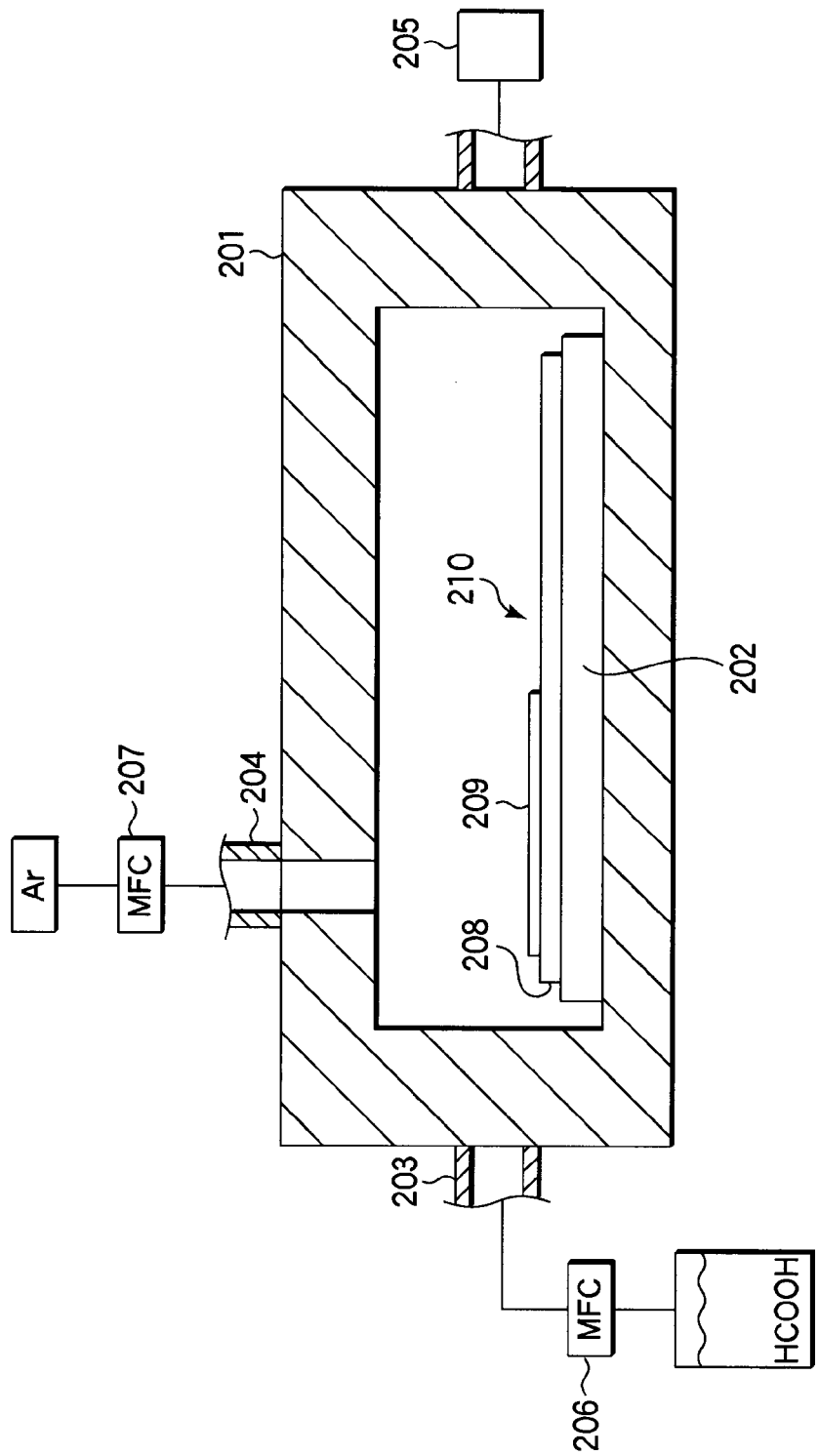
FIG. 15 is a schematic view of an experimental apparatus for confirming the effects of the copper film formation methods according to the embodiments of the present invention.

An experiment conducted to confirm the effects of the copper film formation methods according to the embodiments of the present invention will be explained below. FIG. 15 is a schematic view of an experimental apparatus for confirming the effects of the copper film formation methods according to the embodiments of the present invention.

As shown in FIG. 15, this experimental apparatus was obtained by disposing a ceramics heater 202 for heating a sample 210 placed on it in a vessel 201 capable of accommodating the sample 210. A pipe 203 for supplying formic acid gas into the vessel 201 was connected to the sidewall of the vessel 201, a pipe 204 for supplying argon gas into the vessel 201 was connected to the upper wall of the vessel 201, and a dry pump 205 for exhausting the vessel 201 was connected to that sidewall of the vessel 201 which was opposite to the sidewall to which the pipe 203 was connected. The pipes 203 and 204 had mass flow controllers 206 and 207 for adjusting the flow rates of formic acid gas and argon gas, respectively.

Figure 16:
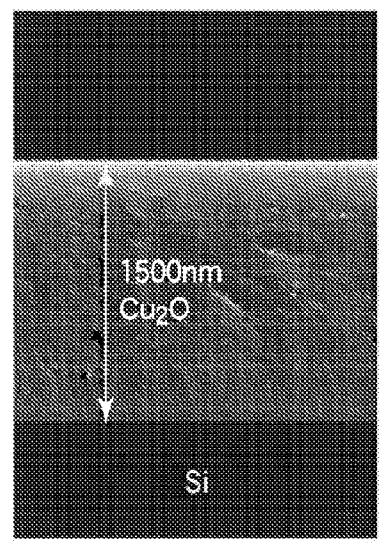
FIG. 16 is a view showing an SEM cross-sectional photograph of a copper(I) oxide film formed on an Si wafer used in an experiment.
Figure 17:
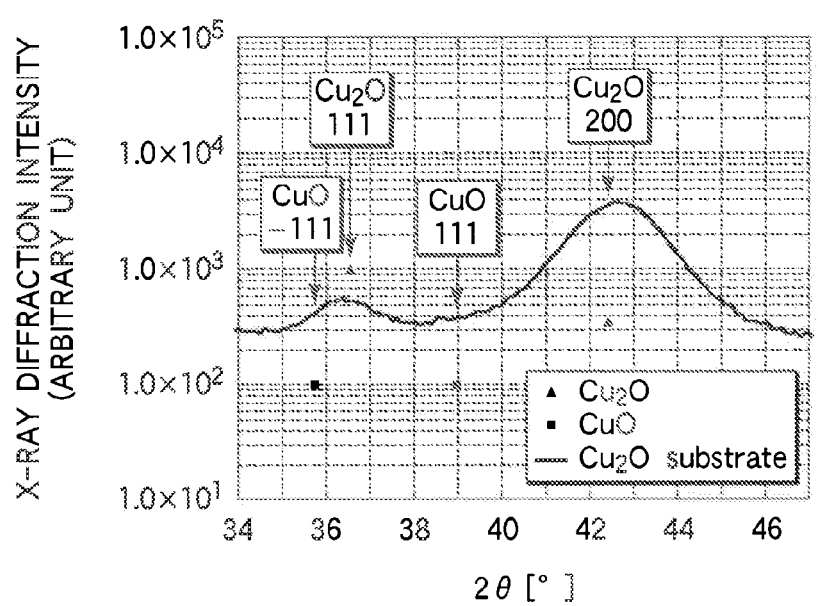
FIG. 17 is a graph showing the X-ray diffraction pattern (XRD) of the copper(I) oxide film obtained by the $\theta$–$2\theta$ method.
Figure 18:
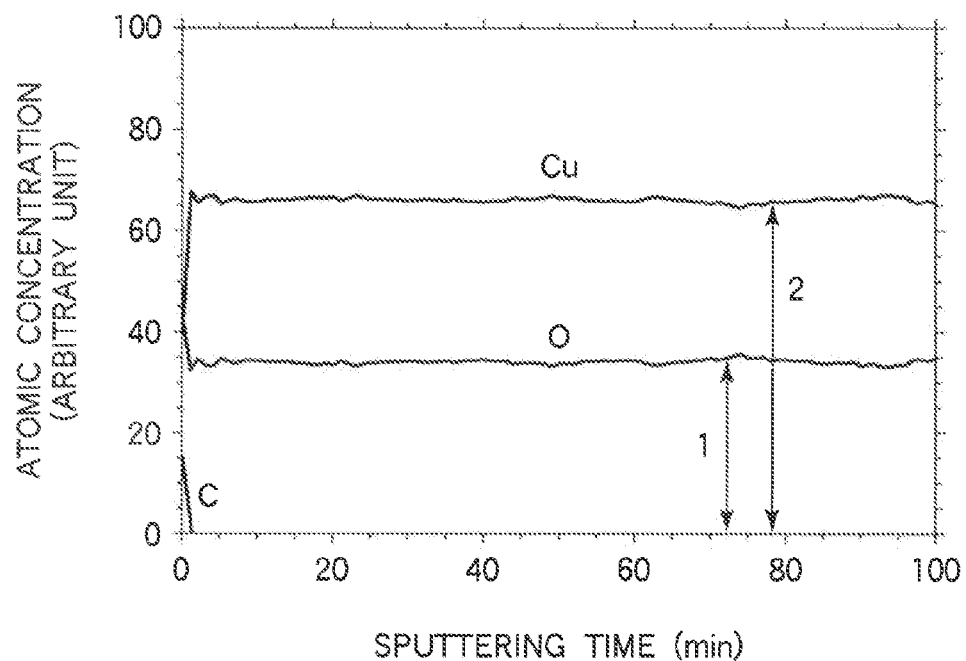
FIG. 18 is a graph showing data obtained by analyzing the composition in the direction of depth of the copper(I) oxide film by X-ray photoelectron spectroscopy (XPS)

The sample 210 was obtained by forming a copper(I) oxide ($Cu_2O$) film 209 on a portion of an Si wafer 208. The copper (I) oxide film 209 was formed by sputtering by masking a portion of the surface of the Si wafer 208. FIG. 16 shows an SEM cross-sectional photograph of the copper(I) oxide film 209 formed on the Si wafer 208. FIG. 17 shows the X-ray diffraction pattern (XRD) of the copper(I) oxide film 209 obtained by the θ–2θ method. FIG. 18 shows data obtained by analyzing the composition in the direction of depth of the copper(I) oxide film 209 by X-ray photoelectron spectroscopy (XPS).

As shown in FIG. 16, the film thickness of the copper(I) oxide film 209 was about 1,500 nm. Also, as shown FIG. 17, the XRD peak value indicates that the copper(I) oxide film 209 was surely made of copper(I) oxide. As shown in FIG. 18, the data analyzed by XPS demonstrates that the composition ratio of copper to oxygen was almost 2:1, i.e., the copper(I) oxide film 209 was certainly made of copper(I) oxide. An experiment was conducted by placing the sample 210 on the ceramics heater 202 such that the side on which the copper(I) oxide film 209 was formed was close to the pipe 203.

Figures 19A, 19B:
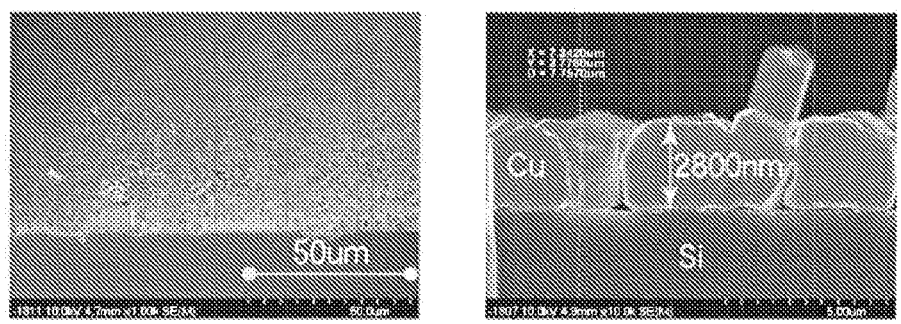
FIGS. 19A and 19B are views showing SEM photographs of a copper film formed on an Si wafer.
Figure 20:
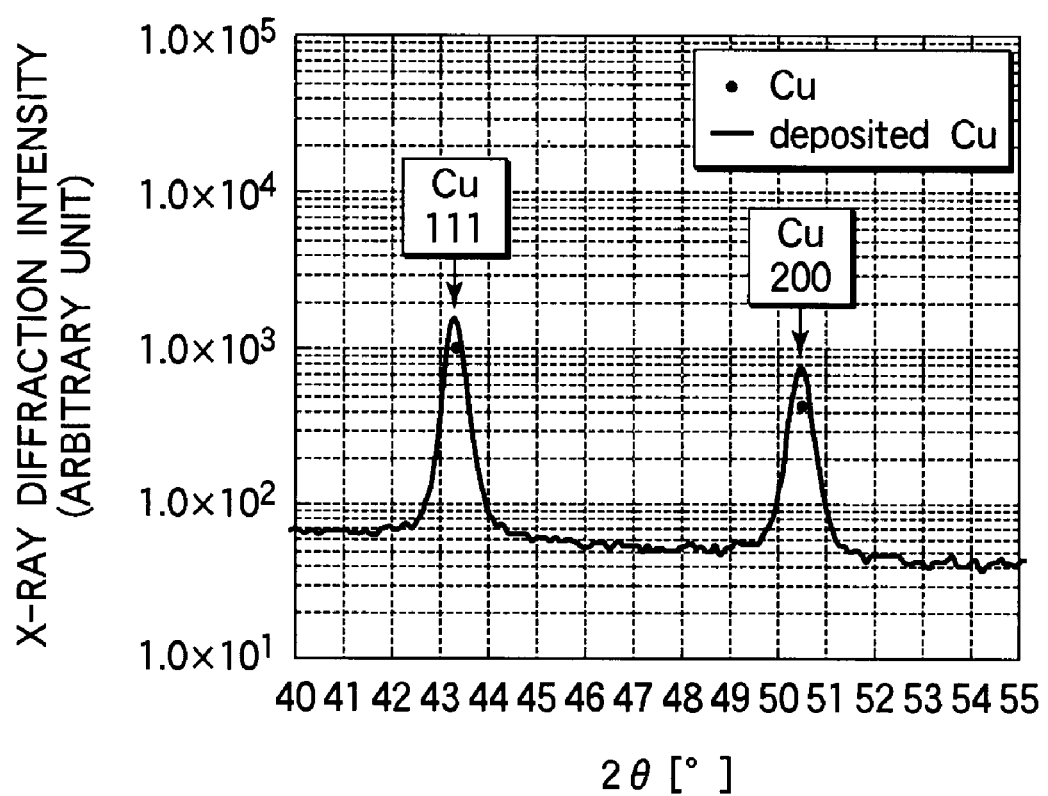
FIG. 20 is a graph showing the XRD of the copper film formed on the Si wafer.

In this experiment, the sample 210 was first heated for 5 min by setting the temperature of the ceramics heater 202 at 200° C., while the internal pressure of the vessel 201 was held at 300 Pa by the dry pump 205 and argon gas was supplied into the vessel 201 at a flow rate of 200 sccm. After that, the supply of the argon gas was stopped, and formic acid gas was supplied into the vessel 201 at a flow rate of 200 sccm for 180 min, with the internal pressure of the vessel 201 being held at 300 Pa and the temperature of the ceramics heater 202 being held at 200° C. Consequently, copper(I) formate was produced by reacting the formic acid gas with copper(I) oxide of the copper(I) oxide film 209, and thermally decomposed to form a copper film on a portion of the Si wafer 208 where the copper(I) oxide film 209 was not formed. FIGS. 19A and 19B respectively show an SEM overhead photograph and SEM cross-sectional photograph of the copper film formed on the Si wafer 208. FIG. 20 shows the XRD of the copper film formed on the Si wafer 208.

As shown in FIGS. 19A and 19B, a thin film about 2,800 nm thick made of masses having a relatively large grain size was formed, and the film formation rate was about 15 nm/min. Also, as shown in FIG. 20, the diffraction peaks of the XRD belonged to copper alone, and there was no diffraction peak of copper oxide, so the thin film was a copper film. That is, it was possible to confirm that a copper film was formed on the Si wafer 208. Accordingly, the above experimental results show that copper(I) formate gas produced by using copper(I) oxide and formic acid as materials can be used as a source gas for forming a copper film by CVD.

The embodiments of the present invention described above can obtain a metal film such as a Cu film or Ag film effective as an interconnection layer with a high step coverage by supplying, onto a substrate, carboxylate salt that thermally decomposes to form a metal film at low energy, and applying energy to this carboxylate salt. In particular, a Cu film can be formed with a high step coverage at extremely low energy by supplying copper formate, preferably, copper(I) formate onto a substrate, and applying energy to this copper formate. In this case, the step coverage can be further increased by using a method of forming a metal film by supplying carboxylate salt such as copper formate onto a substrate to deposit this carboxylate salt on the substrate, and applying energy to the carboxylate salt on the substrate. Since organic ligands to metal atoms in carboxylate salt as a material, more specifically, organic ligands to Cu atoms in copper formate, particularly, copper(I) formate are thermally decomposed and exhausted as a gas having no influence on a metal film (Cu film), an extremely high quality film containing very small amounts of impurities can be obtained. When copper(I) oxide or the like is used as a material, this material is much less expensive than the existing Cu CVD material organic compound, so the material cost can be decreased.

In addition, since carboxylate salt gas (copper formate gas) is produced by reacting carboxylic acid and the oxygen-containing metal compound (typically, formic acid and copper oxide or copper hydroxide) with each other, the amount of carboxylate salt (copper formate) to be produced can be controlled by controlling the amount of carboxylic acid to be supplied. This makes it possible to supply the materials by a stable controllable method and suppress deterioration of the materials, when compared to the conventional method that obtains copper(I) formate gas by heating powdery copper(II) formate. In this case, the oxygen-containing metal compound used as a material, particularly, copper(I) oxide can also be formed as a dense film, unlike copper(II) formate that must be used in the form of a powder. This increases the degree of flexibility of the installation location of the material, e.g., the material can be installed as a wall material or coated on a pipe, thereby making it possible to improve the apparatus, e.g., shorten the transportation length from the substrate for film formation to the material. It is also possible to effectively prevent the formation of copper by thermal decomposition during transportation to the substrate, or the occurrence of solidification by cooling of the decomposition product.

Furthermore, the use of copper(I) formate that thermally decomposes to produce Cu at low energy makes low temperature film formation feasible, and a large amount of formic acid gas can be supplied to the surface of copper oxide because the vapor pressure of formic acid is very high. Accordingly, the flow rate of copper formate gas to be produced can be made much higher than that in the method using the existing organic copper compound. This makes it possible to deposit a large amount of copper formate on a substrate at a low temperature within a short time, thereby implementing practical film formation.

Note that the present invention is not limited to the above embodiments, and various modifications are further possible. For example, the copper(I) formate producing means, copper (I) formate film heating means, and the like are merely examples, and any other means can be used. Also, the above embodiments have been explained by taking, as an example, the case that copper(I) formate is produced by using, e.g., formic acid and copper oxide, and a Cu film is formed by supplying this copper(I) formate to a substrate and decomposing copper(I) formate by applying energy to it. However, the film to be formed is not limited to a Cu film, provided that carboxylate salt is produced by using carboxylic acid and the oxygen-containing metal compound, and a metal film is formed by decomposing this carboxylate salt. When a different metal is used, the formation temperature, formation pressure, and decomposition temperature of carboxylate salt are sometimes different from those for Cu. In addition, although a semiconductor wafer is used as a substrate in the above embodiments, the present invention is also applicable to another substrate such as a glass substrate for a flat panel display (FPD). Furthermore, the present invention includes inventions obtained by appropriately combining the constituent elements of the above embodiments, or inventions obtained by removing some of the constituent elements of the above embodiments, without departing from the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method comprising:
   setting a substrate inside a processing vessel held in a vacuum;
   reacting carboxylic acid with an oxygen-containing metal compound to produce carboxylate salt gas of a metal of the metal compound;
   supplying the carboxylate salt gas of the metal onto the substrate inside the processing vessel; and
   applying energy to the substrate inside the processing vessel to decompose the carboxylate salt of the metal supplied onto the substrate, thereby forming a metal film,
   wherein the carboxylate salt gas is formed outside the processing vessel by reacting the carboxylic acid with the oxygen-containing metal compound, and supplied into the processing vessel through a pipe, and
   the pipe includes an inner surface coated with the oxygen-containing metal compound, and the carboxylate salt gas is produced by causing a carboxylic acid gas serving as the carboxylic acid to flow through the pipe.

2. The film formation method according to claim 1, wherein
   the carboxylate salt is deposited on the substrate by supplying the carboxylate salt gas onto the substrate, and
   the carboxylate salt on the substrate is decomposed by applying energy to the substrate on which the carboxylate salt is deposited.

3. The film formation method according to claim 1, wherein energy is applied to the substrate while the carboxylate salt gas is supplied onto the substrate.

4. The film formation method according to claim 1, wherein the metal is one of copper and silver.

5. The film formation method according to claim 4, wherein the oxygen-containing metal compound is a material selected from the group consisting of copper(I) oxide ($Cu_2O$), copper(II) oxide (CuO), copper(II) hydroxide ($Cu(OH)_2$), silver(I) oxide ($Ag_2O$), and silver(II) oxide ($Ag_2O_2$).

6. The film formation method according to claim 1, wherein the carboxylic acid is an acid selected from the group consisting of formic acid, acetic acid, propionic acid, valeric acid, and butyric acid.

7. The film formation method according to claim 1, wherein the carboxylic acid is formic acid, the oxygen-containing metal compound is an oxygen-containing copper compound, the carboxylate salt gas is copper formate gas, and the metal film is a copper film.

8. The film formation method according to claim 1, wherein energy applied to the substrate is heat energy.

9. The film formation method according to claim 8, wherein a resistance heating element formed in a substrate support member which supports the substrate applies heat energy to the substrate.

10. The film formation method according to claim 8, wherein a heating lamp disposed in a position apart from the substrate applies heat energy to the substrate.

* * * * *